United States Patent [19]

Iversen et al.

[11] Patent Number: 5,537,074
[45] Date of Patent: Jul. 16, 1996

[54] POWER SEMICONDUCTOR PACKAGING

[76] Inventors: Arthur H. Iversen, 15315 Sobey Rd., Saratoga, Calif. 95070; George Gabor, 820 Skywood Rd., Lafayette, Calif. 94549

[21] Appl. No.: 211,880
[22] PCT Filed: Aug. 24, 1993
[86] PCT No.: PCT/US93/07974
  § 371 Date: May 10, 1994
  § 102(e) Date: May 10, 1994
[87] PCT Pub. No.: WO94/05040
  PCT Pub. Date: Mar. 3, 1994
[51] Int. Cl.[6] .......................... H01L 25/00; H01L 23/34
[52] U.S. Cl. .......................... 327/564; 327/565; 257/712; 257/713; 257/714
[58] Field of Search ............................ 327/566, 530, 327/535, 537, 538, 541, 108; 257/337, 341, 368, 712

[56] References Cited

U.S. PATENT DOCUMENTS

| | | | |
|---|---|---|---|
| 4,866,495 | 9/1989 | Kinzer | 257/337 |
| 4,891,686 | 1/1990 | Krausse, III | 257/341 |
| 4,907,068 | 3/1990 | Amann et al. | 257/341 |
| 5,043,859 | 8/1991 | Korman et al. | 257/368 |

Primary Examiner—David C. Nelms
Assistant Examiner—Trong Phan
Attorney, Agent, or Firm—Michael A. Lechter

[57] ABSTRACT

Power output switching circuit (215) for use in high current and high frequency applications. The output circuit provides a series of geometrically symmetric parallel spaced semiconductor converters (214A, 214B, 216A, 216B) arranged such that the voltage for each semiconductor output device is substantially equal and minimal for each device. In this way, each device exhibits substantially the same impedance, such that circuit performance is largely a function of intrinsic device characteristics, and substantially independent of cross coupling and another external influences.

22 Claims, 21 Drawing Sheets

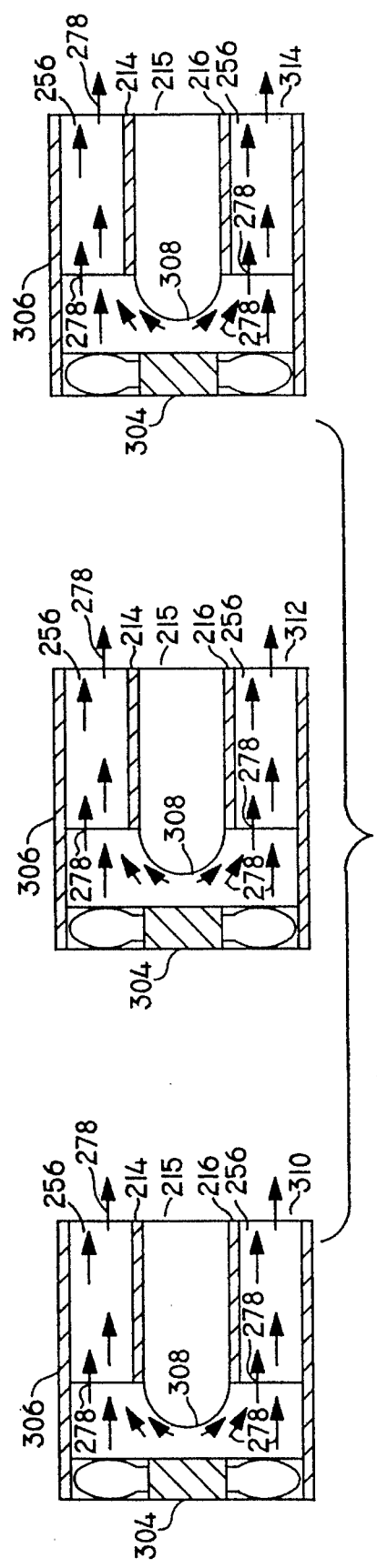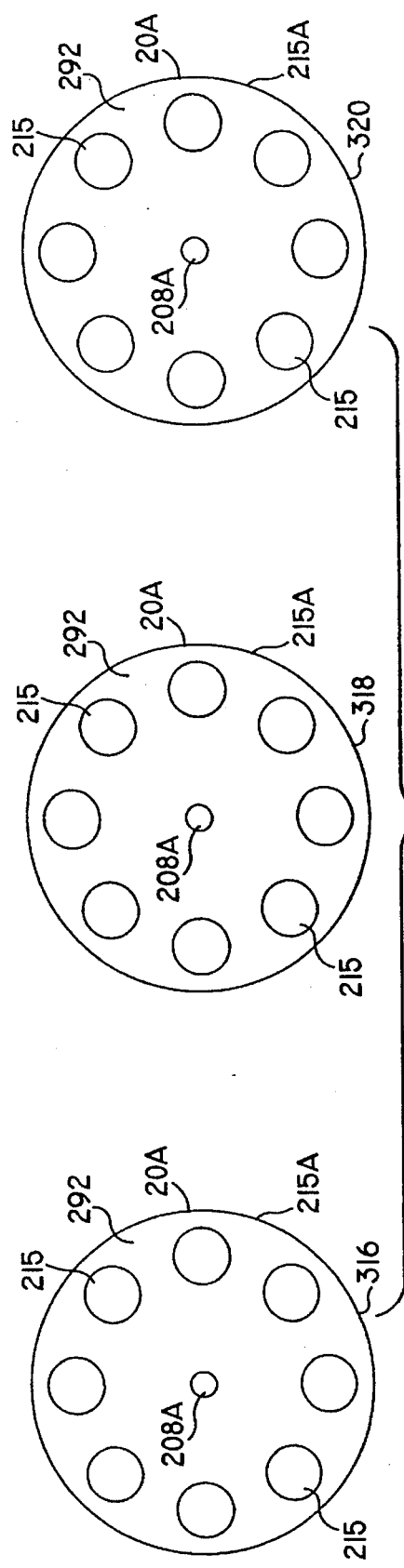
FIG. 25
FIG. 26

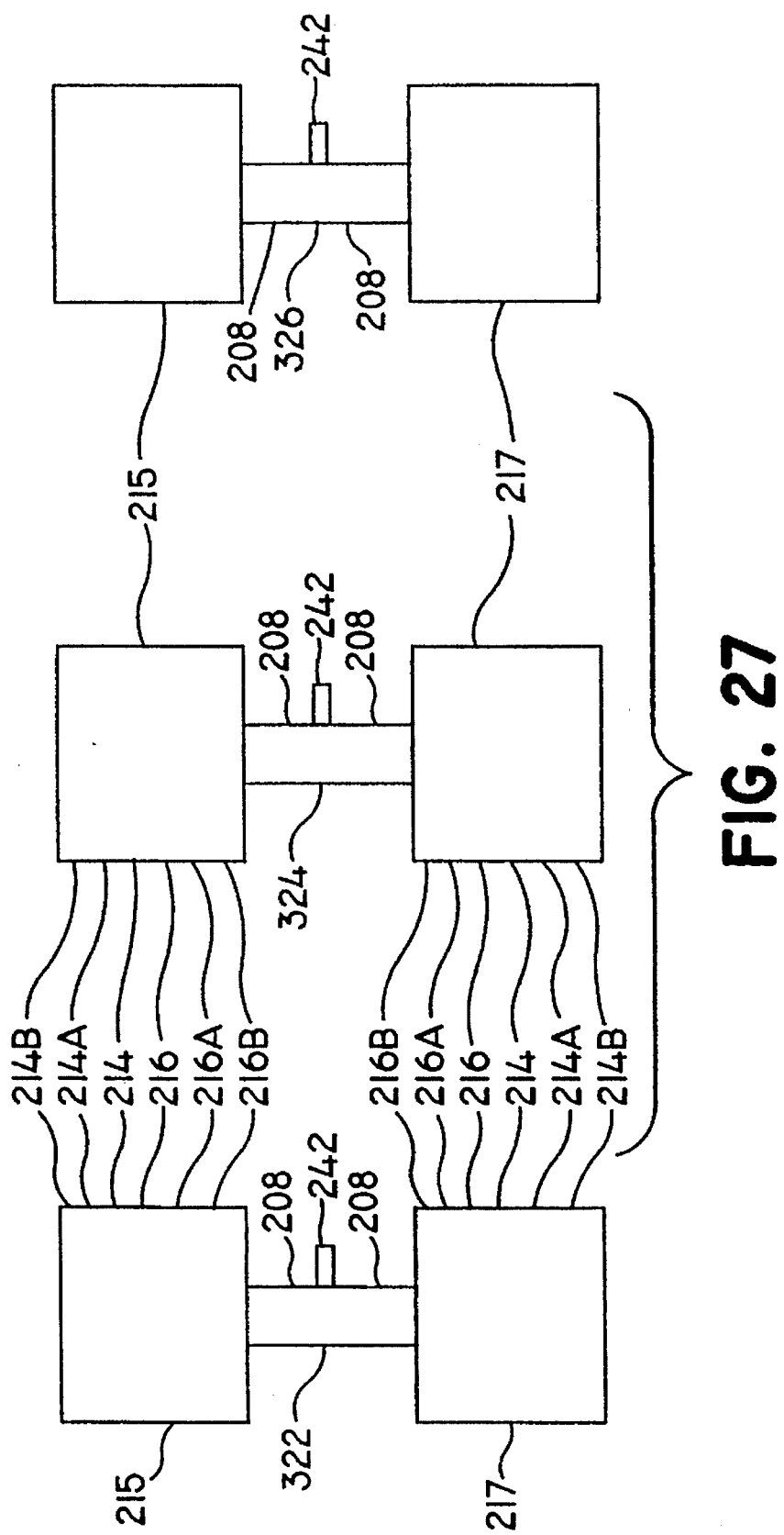

5,537,074

POWER SEMICONDUCTOR PACKAGING

This application is a filing under 35 U.S.C. 371 of PCT/US93/07974.

TECHNICAL FIELD

The present invention relates, generally, to power output switching circuitry incorporating multiple paralleled semiconductors carrying high current or operating at high frequencies, and more particularly to power output drivers with ratings in the range of one kilowatt and above and employing signal frequencies in the range of 10 Khz, including power converters for AC to AC, DC to DC, AC to DC, DC to AC, and power amplifiers of the A, AB, B, C and D types and their various subtypes.

BACKGROUND OF THE INVENTION

The performance of semiconductor circuit designs employing multiple paralleled devices operating at high currents and/or at high frequencies, e.g., above 10 Khz, is often limited by the mutual interaction of the paralleled devices. In particular, conventional power converter performance is limited in the frequency-power product available. There are high power converters in the sub-hundred kilowatt to multi-megawatt range that employ switching frequencies in the 1 Khz range using SCRs (Silicon Controlled Rectifiers), thyristors and GTOs. In the tens of kilowatt range with switching frequencies from about 1 Khz to about 10 Khz, converters often use, for example, IGBTs (insulated Gate Bi-Polar Transistors) and Bi-Polar power devices. Higher frequency operation with IGBTs and Bi-Polar devices is accomplished with higher losses, more complexity, restrictive performance and increased expense. A particularly suitable device for high frequency converter operation is the power MOSFET (Metal Oxide Silicon Field Effect Transistors). MOSFETs are capable of switching frequencies in the Mhz range and are simple to control. However, MOSFETs are subject to higher resistive losses for comparable maximum current for each device. Such losses, however, can be controlled with efficient thermal management that provides low operating junction temperatures.

Conventional converter construction and operation does not lend itself to high switching frequencies, e.g., >10 Khz operation, without high losses. Additionally, conventional converter construction does not lend itself well to the parallel operation of power MOSFETs at high switching frequencies, due to the mutual interaction, or cross-talk, between the parallel devices. The need exists for circuit designs and constructs that provide for the efficient paralleled operation of multiple devices at high currents and high signal frequencies.

SUMMARY OF THE INVENTION

The present invention provides for the substantial elimination of the generally performance degrading mutual interaction of paralleled devices in power output driver circuits employing high signal frequencies and/or high currents.

The present invention provides for the construction and operation of high frequency, high power converters.

The present invention provides for the construction and operation of high efficiency converters.

The present invention provides for the low cost construction of the output drivers for compact, high efficiency, and high frequency converters.

BRIEF DESCRIPTION OF THE DRAWINGS

The present invention is hereinafter described in conjunction with the appended drawing of figures, wherein like designations denote like elements, and:

FIG. 25 is a three phase air cooled power source comprising three single phase packages of fan, housing, and voltage stages;

FIG. 26 is a three phase air cooled power source comprising three circular symmetric, single phase power output drives incorporating multiple voltage output stages;

FIG. 27 is a three phase liquid cooled power source comprising three output stages;

DETAILED DESCRIPTION OF A PREFERRED EXEMPLARY EMBODIMENT

Figure 2:
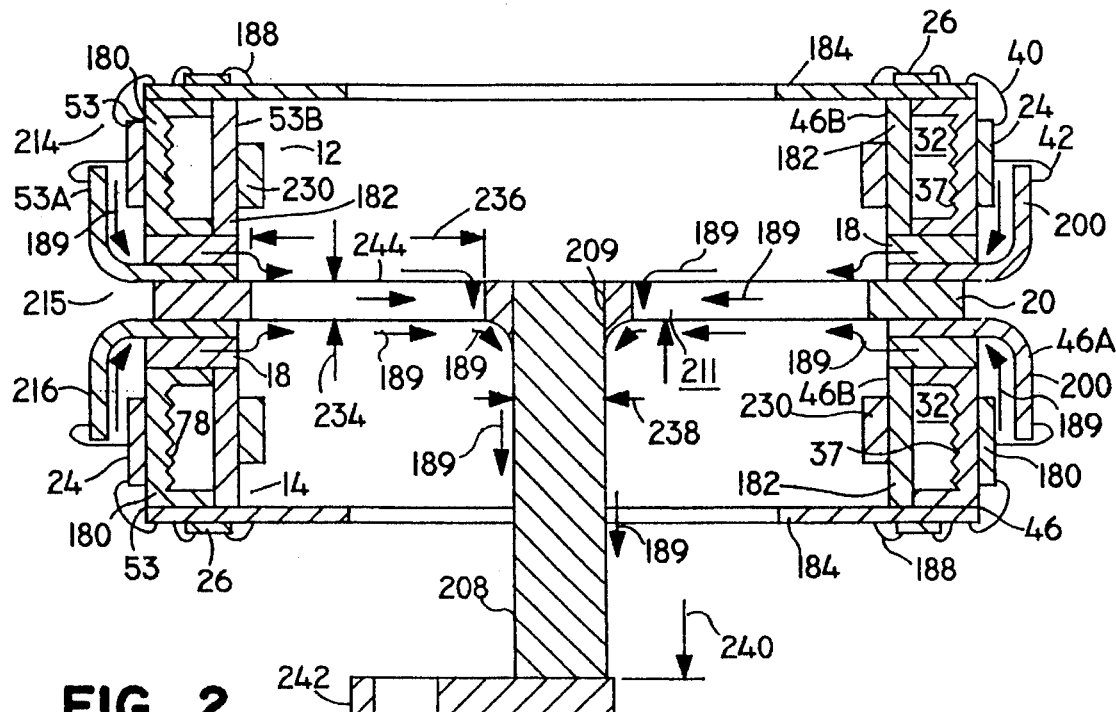
FIG. 2 is a cross section view taken along line II—II of the circular symmetric liquid cooled power output driver of FIG. 1.

The geometric arrangement and topologies described herein are particularly beneficial in circuits employing multiple paralleled devices for high power output at high frequencies, for example greater than 10 Khz. Considerable advantage is obtained using the present invention in the construction and operation of a class of circuitry known in the art as power converters. Power converters are generally understood to include, inter alia, AC-to-AC and DC-to-DC, converters, as well as AC to DC converters (sometimes called rectifiers) and DC to AC converters (sometimes called inverters). Those skilled in the art will also appreciate that the term power converters also includes power amplifiers of the A, AB, B, C and D types and their various subtypes.

The present invention specifically addresses the power output driver stages of the aforementioned converters and amplifiers, and such other power circuit designs that employ high current outputs (as defined herein). The terms converter, amplifier or other power circuit are used herein to refer specifically to the power output driver stage of the converter, amplifier or other power circuit design. Power output drivers configured in accordance with the present invention are generally characterized by electrically and mechanically symmetric construction and a minimization of output impedance, such that intrinsic device properties, rather than the cumulative adverse device interactions among the devices, determine converter output performance. In accordance with one aspect of the invention, this means that the voltage due to the inductance, capacitance, and resistance in a device path are substantially equal and substantially minimized for each device.

An exemplary converter in accordance with the present invention suitably comprises one or more high current output stages typically operated at a total output power in the range of at least one Kw and employs a switching frequency in the range of least 10 Khz. The individual output stage contains at least one voltage output stage. The output voltage stage consists of at least one stage element. Multiple stage elements may be seriesed for high output voltage or paralleled to increase current output, or multiple stage elements may be configured in a combined series-parallel construction for high voltage and high current output. A stage element suitably comprises a substrate of high electrical and thermal conductivity, e.g., a metal such as copper, copper alloys, aluminum, molybdenum, tungsten etc., upon which are mounted, in an electrically and thermally conductive manner, multiple paralleled power devices with their associated driver devices placed in dose proximity on electrically insulated mountings. The electrically and thermally conductive substrate is both a circuit element (e.g., a drain) and a heat sink which may be cooled by gas, liquid, or vapor. The devices are advantageously disposed on the substrate in an electrically symmetrical manner. As discussed in greater detail below, cooling of the substrate may be accomplished with a suitable fluid such as liquid, gas or vapor.

The output stages may be configured as a single output stage, two output stages for a half bridge structure, or four output stages for a full bridge structure. Multiple output stages may be employed for polyphase operation, e.g., three half bridges for three phase circuits, that is, one half bridge for each leg of the circuit.

The terms semiconductor and/or device, and chip, whether in the context of a packaged chip or bare die, are treated as functionally equivalent in the context of the present invention and, hence, are used interchangeably. Inside and outside corners of all surfaces subject to high sheet currents are desirably radiused to reduce reflections due to high frequency components of AC signals (see FIG. 10). "High" currents, as used herein, generally means those currents which when applied to electrically asymmetrical paralleled devices cause unequal current sharing between devices as a result of the asymmetry.

For illustration purposes the present invention is described in the context of power MOSFETs and associated terminology. However, any device having functionality comparable to MOSFETs can be utilized in the same fashion. Moreover, the present invention is not restricted to three terminal devices; it may be generalized to devices with four or more terminals.

Electrical symmetry is herein defined for multiple paralleled devices in a circuit such that between individual devices and the output terminal, each device has substantially the same output impedance as every other device, such that each device carries substantially the same current (i.e., there is uniform current sharing among the devices). Because of this symmetry, the gate drive signals applied to the parallel devices may be advantageously substantially uniform in timing and amplitude. Such electrical symmetry results in a dramatic reduction in cross coupling among the devices.

The maximum current a given device can conduct when operating at its maximum power point on the upper edge of its SOAR (Safe Operating Area) curve, defines the performance limits of a given device. When multiple devices are paralleled in a circuit to increase the output current of that circuit, the individual paralleled devices typically cannot be simultaneously operated near their maximum current; that is, the devices are appreciably derated, and the circuit current is electrically asymmetrical. A possible test for measuring the extent of electrical symmetry in a circuit incorporating multiple paralleled devices is to operate the least conductive device along the upper edge of its SOAR curve to its maximum power point which is defined when the junction temperature ($T_j$) of the device reaches the maximum specified for the device. If the other paralleled devices exceed the manufacturer's specification for $T_j$ and/or current, the circuit is asymmetrical. If all devices have substantially identical $T_j$ and I (current) conduction, the circuit is symmetrical.

Preferred embodiments of electrically symmetrical circuit topologies as described herein are characterized by current flow from the paralleled power semiconductors on the stage elements being generally orthogonal, on average, to a line joining the centers of the paralleled power semiconductors; consequently, the current flowing away from each semiconductor travels in such manner as to minimize the effect on the performance characteristics of any of the other semiconductors. Construction of the stage elements is such that the current flow from any of the paralleled devices does not cross or merge, in any substantial manner, with the current flow from any of the other paralleled devices on a stage element. More precisely stated, Div I, $\approx 0$ and $I_j \bullet I_{j+1} \approx 0$ where I is the total current through the stage element, and $I_j$ is equal to the current through device j, with j ranging from 1 to (n−1) where n is the number of paralleled power devices on a stage element.

Figure 32:
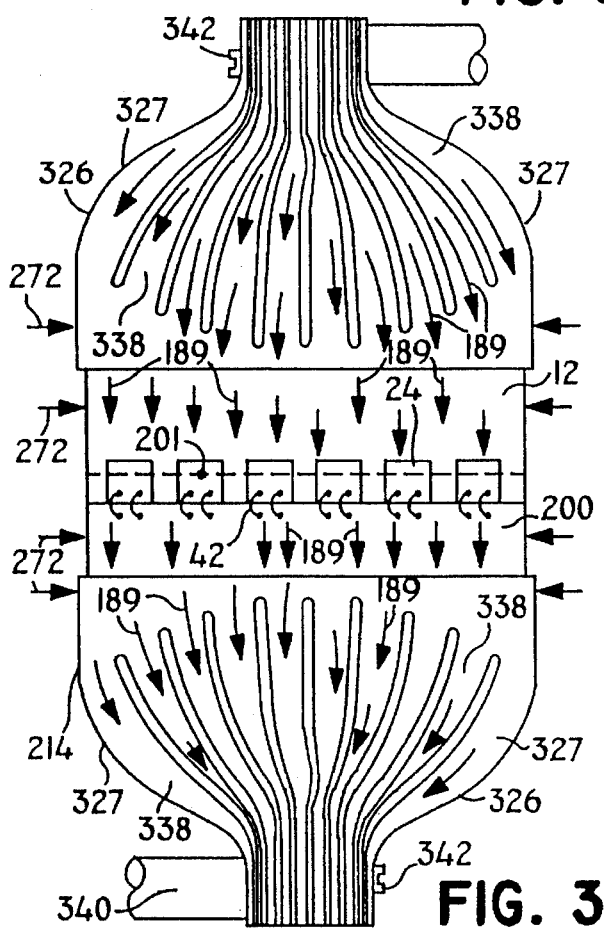
FIG. 32 is a top view of a linear air cooled output stage with multiple paralleled slit sheet conductors for both input and output appendage interconnects.

As explained in greater detail below, the circuit arrangements of the present invention are configured to transform a "point" source of high frequency current at the input into an extended and uniform sheet current which is applied to and modulated by the multiple paralleled power devices, whereupon the current is again transformed into a "point" source of current at the output. The parallel current flow from any device, in accordance with the present invention, does not merge or cross the path of the current flow of any other device on a stage element in any substantial manner, thereby minimizing any adverse mutual device cross coupling among the parallelled devices. Thus, high frequency and related losses of the modulating and output signals are determined by the intrinsic properties of the devices, rather than by adverse mutual device cross coupling as in the prior art. FIG. 32 best illustrates this point-to-point transition from input to output in the context of the present invention.

In order to facilitate the uniform distribution of current to the various paralleled devices, it is desirable to control the electrical characteristics of the current path for the devices such that, inter alia, each device "sees" substantially the same impedance and the respective voltage drops across each device are substantially equal. In this regard, the voltages developed in a device path (VR) for each device may be expressed as V=VL+VC+VR, where i is the device current; VC=C i dt, where C is the path capacitance; VL=L di/dt, where di/dt is the time rate of change of the current and L is the path inductance; and VR=Ir, where R the effective resistance due to the skin effect of the conductors.

Substantially identical device impedance permits the driving signals to all devices on a substrate to be substantially uniform in timing and magnitude. This ensures that the converter turn on and turn off time is substantially uniform and is substantially determined by the intrinsic characteristics of a device and not degraded by the cumulative interaction of the multiple paralleled devices on the substrate.

Figure 1:
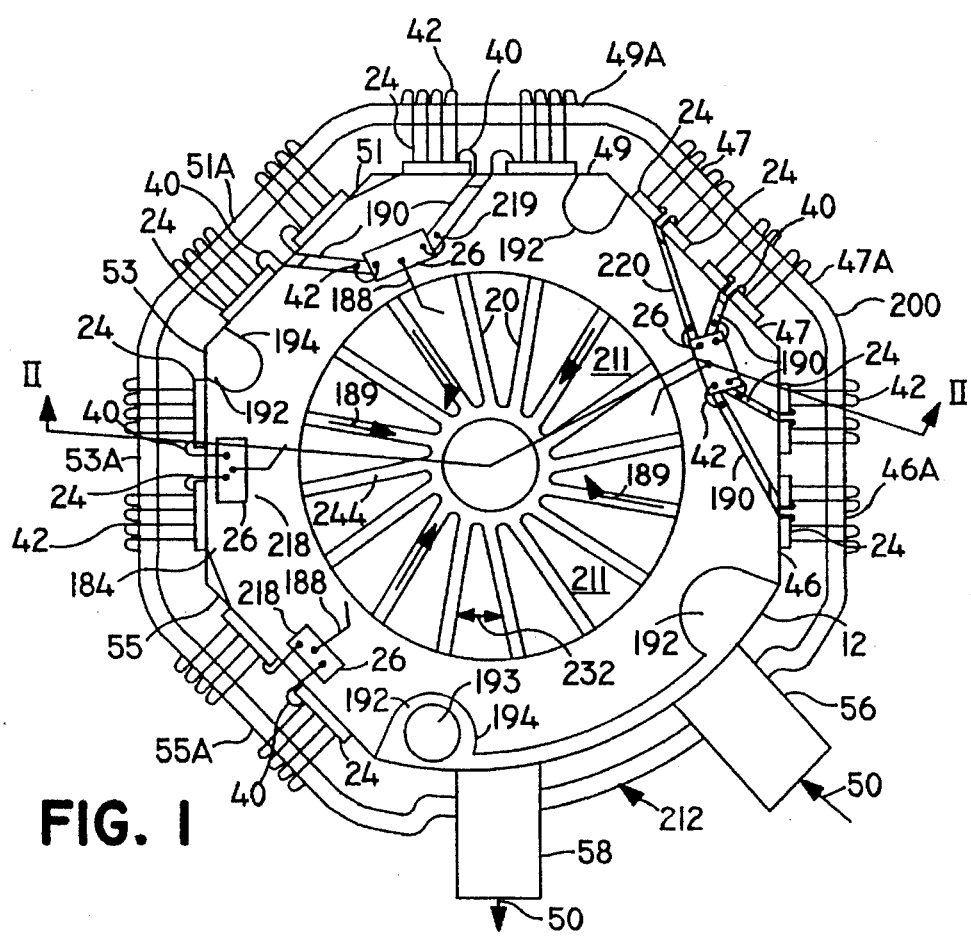
FIG. 1 is a top view of an exemplary circular symmetric liquid cooled power output driver in accordance with the present invention.
Figure 5:
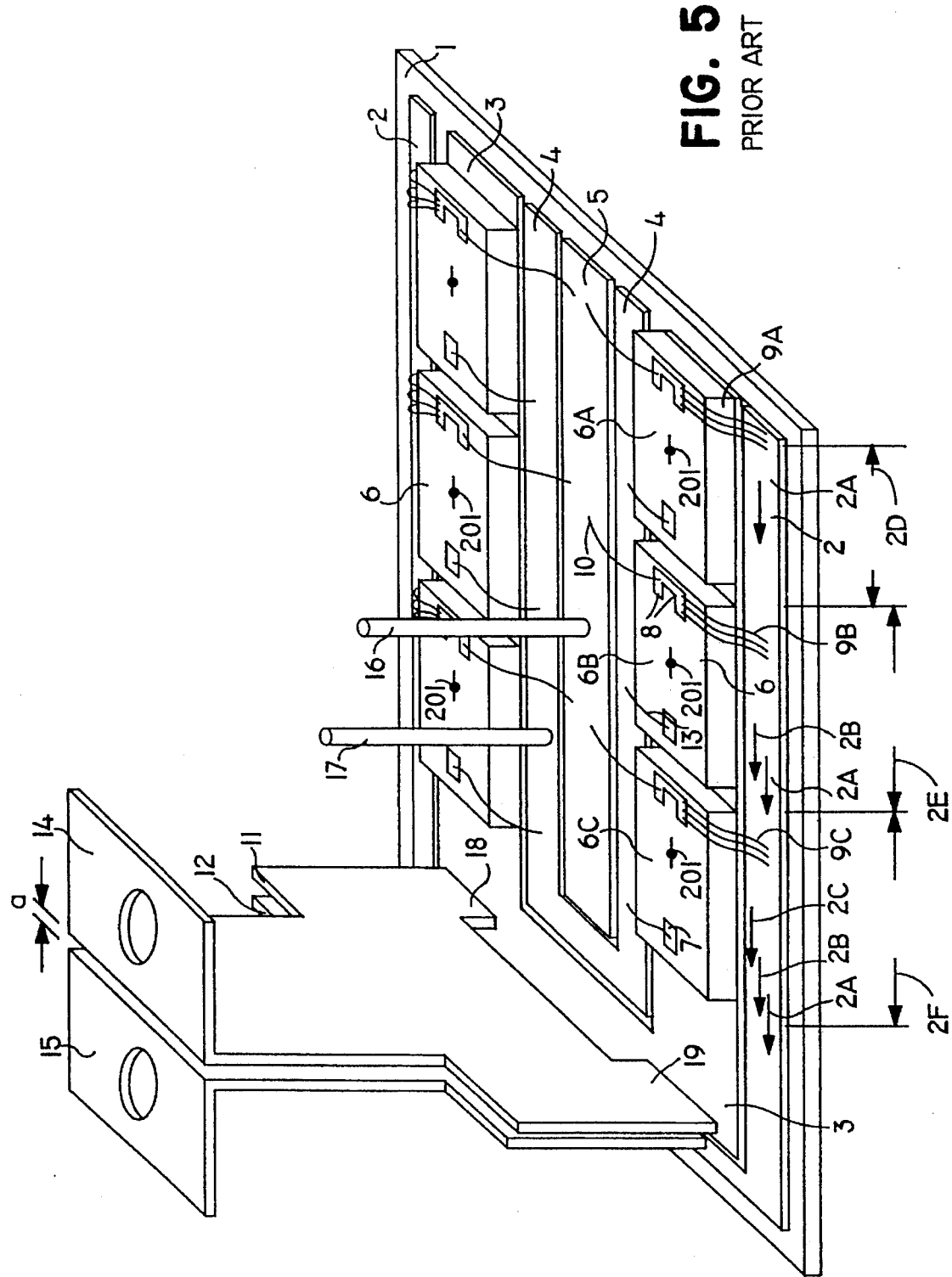
FIG. 5 shows a prior art driver configuration illustrating asymmetrical electrical construction.

Referring now to FIG. 5 (which is a reproduction of FIG. 1 of Amann et. al. U.S. Pat. No. 4,907,068), the design of conventional output circuitry employing paralleled devices, is generally characterized by non uniform device-to-device impedance. As a result, the cumulative current flow from each device gives rise to strong non uniform current sharing between devices, i.e., asymmetrical mutual cross coupling between devices. The non-uniform IR and di/dt voltage drops which cause uneven current sharing also effect the driving signals resulting in nonuniform timing and amplitudes. More particularly, a plurality of devices 6 are mounted on a "U"-shaped drain interconnect 3, with three devices 6 disposed symmetrically on each leg of drain interconnect 3. A drain electrode 11, having a drain electrode terminal 14 extending therefrom, is provided at the center of the "U"-shaped segment of drain 3. A "U" shaped source interconnect 2 surrounds the outer perimeter of drain interconnect 3. A source output electrode 12, having an electrode terminal 15 extending therefrom is provided at the center of the "U" segment of source interconnect 2. Thus, three devices 6 are disposed on each side of source electrode 12 and drain electrode 11.

The three devices 6 on one leg of drain interconnect 3 are labeled 6A, 6B and 6C with device 6A being furthest from source output lead 12. All devices 6 are of similar construction and, hence, have the same current flowing therethrough.

The output current 2A from furthest extreme device 6A flows through source leads 9A onto source interconnect 2. As current 2A passes device 6B, it is joined by current 2B which flows from device 6B through source leads 9B. In like manner as currents 2A+2B pass device 6C, the current 2C from device 6C passes through source leads 9C to join currents 2A+2B. The total current on source interconnect 2 intermediate device 6C and source electrode 12 is thus 2A+2B+2C. As discussed in greater detail in connection with preferred embodiments of the present invention, the current flow 2A–2C from devices 6A–6C is generally, i.e., on average, parallel to a line 201 joining the centers of devices 6A–6C. If source leg 2 is considered as comprising respective continuous segments 2D, 2E and 2F each of approximately equal length and corresponding to devices 6A, 6B and 6C, respectively, and further assuming that each segment exhibits equal resistance R, the voltage drop along interconnect 2 and its effect on converter performance may now be described.

The voltage drop delta $V_1$ along segment 2D due to resistive loss is $\Delta V = IR$, where I is equal to the magnitude of current 2A. The voltage drop delta $V_2$ along segment 2E is thus 2 IR, due to the additive effect respective of currents 2A and 2B. The voltage drop delta $V_3$ along segment 2F is thus 3 IR due to the cumulative effects of respective currents 2A, 2B, and 2C. In addition to the voltage drops due to resistive losses, there is an additional voltage drop due to inductance. Assuming each device has the same inductance L, an additional voltage drop of $VL = L\, di/dt$ across each device will result. The combined voltage drop V across each device may then be generalized as $\Delta V + V_L = IR + L(di/dt)$. The voltage drop V across each device is then $V_A = IR + L(di/dt)$. The voltage drop across device 6A is $V_A = IR + L(di_A/dt)$, across device 6B it is $V_B = 2IR + L(diB/dt)$, and across device 6C it is $V_C = 3IR + L(di_C/dt)$. A further complication surrounds the progressively increasing incremental inductance (L) difference among each device 6A, 6B, 6C which causes them to turn on or off at different times by delaying the controlling signal by different amounts and reducing the amplitude of the controlling signal by a different amount VL for each device.

To illustrate the effect of the foregoing, consider the following example. Let $V_S$ be the applied source-to-gate voltage across drain terminal 14 and source terminal 15. The gate voltage $V_G$ appearing across a particular device is $V_S$ minus both the resistive and inductive voltage losses attributable to that device. In particular, the gate voltage $V_{GC}$ that appears across device 6C is $V_{GC} = V_S - V_C$; for device 6B, the gate voltage is $V_{GB} = V_S - V_C - V_B$, and for device 6A, the gate voltage is $V_{GA} = V_S - V_C - V_B - V_A$. Assuming $V_A$, $V_B$, $V_C$ are proportional to the current I, and if $V_A = 0.5V$, then $V_B = 1$ V and $V_C = 1.5$ V. Assuming $V_S = 6$ volts, then the gate voltage at device 6C is $V_{GC} = 6 - 1.5 = 4.5$ volts. For device 6B the gate voltage is $V_{GB} = 6 - 1.5 - 1 = 3.5$ volts, and for device 6A the gate voltage is $V_{GA} = 6 - 0.5 - 1 - 1.5 = 3$ volts. Depending on the intrinsic threshold gating voltage for the devices, device 6A may not turn on at an applied gate voltage of 3 volts. Device 6C by virtue of the highest applied gate voltage will carry the highest current, with devices 6B and 6A carrying progressively less current. This is graphically illustrated in the device transfer function curve shown in FIG. 6, which shows the device currents drawn, 2A, 2B, 2C, at the various gate voltages. This non-uniform sharing of current places the greatest load on device 6C as well as generating increasing losses. In general, to prevent premature failure, the converter is compensatorily derated.

In addition to performance degradation resulting from the above described static transfer behavior, further performance degradation arises from dynamic device behavior. In the prior art structure shown in FIG. 5, the source voltage generator drives across the output impedance of each device. However, because of the difference in effective lengths of the output leads (source buss 3) and, hence, the correspondingly different outputs inductance and resistance values for each device, each device has a different output impedance and therefore receives a different drive voltage level. Furthermore, output devices by virtue of their power capabilities have large junction areas producing high input capacitances. The input buss structure, with its conventional device distribution, thus exhibits substantial signal propagation delay from device to device. The effect of this delay is exacerbated in the context of a fast rise time switching signal, wherein the first device in line may turn on before the last device has received the control signal. The converse is true when the drive signal turns the devices off. The highest frequency at which such an arrangement can operate is thus limited by the configuration of the circuit, rather than by intrinsic qualities of the devices. This increases switching losses as well as reducing the maximum achievable switching frequency.

As discussed above, conventional converters employing multiple paralleled power devices are not electrically symmetrical; rather, they are electrically asymmetrical, resulting in unequal device output current sharing and, in turn, nonuniform switching and device conductance. Progressively different gate voltages appear across each device which gives rise to differing device output currents. The output of a device and its differing output impedance effectively modulates the other devices' output performance. The cumulative affect of such intermodulation results in nonuniform switching times, higher energy losses and even the possibility of some devices not turning on. There is, in effect, a cascading deterioration in performance.

Referring now to FIGS. 1 and 2, an exemplary liquid cooled single phase inverter 201 suitably comprises a single output stage 215 including a positive output voltage stage 214 and a negative output voltage stage 216. Inverter 201 further comprises a positive drain 12 and a negative drain 14 each comprising a generally circular symmetric outer ring 180 and generally circular symmetric inner ring 182. As described in greater detail in conjunction with FIGS. 7 and 8, each outer ring 180 is suitably prepared with respective external peripheral flats 46, 47, 49, 51, 53 and 55, and an extended heat exchange surface 37 within a cooling conduit 32. Inner ring 182 suitably extends the height 39 (See FIG. 7) of drains 12 and 14 and is joined in a liquid tight manner, for example by soldering, brazing, welding adhesives etc. to outer ring 180. Inner ring 182 may be provided with respective flats 46B, 47B, 49B, 5B, 53B, 55B, (46B, 53B shown in FIG. 2, the remainder are not shown ) on its inside perimeter corresponding to and opposing respective flats 46, 47, 49, 51, 53, 55 on outer ring 180. Respective protective devices 230, such as MOVs or diodes, are suitably attached to interior flats 46B–55B of inner ring 182 which provide high voltage transient protection for devices 24. The close proximity of protective devices 230 to devices 24 and board 184 provides short lead lengths for minimum inductance and parasitics. In addition, devices 230 are cooled by inner ring 182 which comprises one wall of coolant conduit 32.

With continued reference to FIGS. 1 and 2, inverter 201 comprises a circuit board 184 having a plurality of output drivers 26 mounted thereon, which drivers are driven by a docking signal through a clock line 188 connected to each of respective chips 26. The appropriate driver output signal drives chips 24 on positive and negative drains 12 and 14 with the proper signals to provide an AC output.

Three alternative electrically symmetrical driver 26-to-device 24 connection configurations 218, 219, 220 are shown. In configuration 218, driver chips 26 are directly connected to devices 24 on respective drain flats 53, 55 by lead wires 40. Two lead wires 40 connect to two adjacent devices 24 with wires 40 suitably attached to the closest corners of devices 24 to ensure the shortest possible lead length for minimum inductance and parasitics. It is seen that each lead 40 is independent and similarly configured (i.e., symmetrical) and therefore there is negligible electrical interaction between the leads. In configuration 219, one driver chip 26 serves two devices 24 on each of respective drain flats 49, 51. Respective interconnect lines (busses) 190 extend from driver 26 to the mid point of devices 24 on flat 49, and in like manner from driver 26 to the midpoint of devices 24 on flat 51. A source lead 42 interconnects each drive chip 26 with a particular drive line 190; a gate lead 40 interconnects each chip 24 with a particular line 190. Drive lines 190 are desirably of the shortest length necessary to facilitate connection between a driver 26 and a device 24, and have substantially symmetrical electrical characteristics. The driving signal from driver chips 26 travel down respective interconnect legs 190 to respective devices 24 on drains 12, 14 flats 49, 51. By configuring respective legs 190 to be separate, distinct, and electrically symmetrical, negligible electrical interaction between legs 190 may be achieved. Respective lead wires 40 from interconnect 190 to devices 24 on each flat 49, 51 are suitably adjacent to each other and symmetrical; thus, current to one device 24 creates essentially no effective voltage across the adjacent device 24, and vice-versa. Both devices 24 effectively "see" the same interconnect 190 and lead 40 length, neither of which is downstream of the other. This property is advantageously true for all three configurations 218, 219, 220.

In configuration 220, where driver chip 26 drives eight devices 24 (four each on flats 46 and 47), it is seen that the outer pair of legs of interconnect 190 are of a different length than the inner legs. In this regard, it is desirable that the difference in length of respective interconnects 190 is kept small such that any differential voltage drop between the short and long legs is negligible.

In the context of the present invention, of primary concern are the currents flowing from output power devices 24 and it is here that substantial caution is required. Again referring to FIGS. 1 and 2, source leads 42 interconnect devices 24 with a source 200. Multiple source wires 42 are connected to each device 24 (FIG. 4) to reduce inductance. To maintain substantially equal wire 42 lengths and thus provide uniform wire inductance, wires 42 attach along a line 248 across devices 24 (see FIG. 12). As shown in FIG. 1, source 200 is provided with flats 46A, 47A, 49A, 51A, 53A, 55A generally corresponding to and opposing flats 46, 47, 49, 51, 53, 55 on drains 12, 14. Source wires 42 from flats 46A, 47A, 49A, 51A, 53A, 55A to devices 24 are of substantially uniform length. With substantially uniform source wire 42 lengths from all devices 24 to source 200, resistive and inductive voltage drops will be substantially uniform for each device 24. In addition, the current flow from any device 24 through source wire 42 does not flow past or interact in any substantial manner with any other device 24. Therefore, the circuit from devices 24 to source 200 is electrically symmetrical.

With continued reference to FIGS. 1 and 2, respective sources 200 are electrically and mechanically attached to a source interconnect 20. The current (indicated by current arrow 189) from symmetrical sources 200 of both positive stage 214 and negative stage 216 flows radially inward along source interconnect 20 to an axial source appendage interconnect 208. Source interconnect 20 is provided with respective alternating cutouts 211 and spokes 244 suitably configured in the shape of a wagon wheel with the radially extending spokes 244 connecting axial source appendage interconnect 208 to the outer hub of interconnect 20. Spokes 244 provide for the flow of current 189 from respective sources 200 to axial source appendage interconnect 208 which is journalled within a central bore 20 of a source interconnect 20 to thereby maintain electrical contact between interconnect 208 and interconnect 20. Again referring to FIG. 1, the width 232 of cutout 211 is advantageously greater than the thickness 234 of source interconnect 20. The length 236 of cutout 211 is at least three times, and preferably five to ten times the thickness 234 of source interconnect 20. Axial source appendage interconnect 208 is illustratively cylindrical, has a perimeter 238 and has a length (indicated by arrows 240) which is at least as great as its perimeter (indicated by arrows 238) and preferably at least twice as large as perimeter 238 to uniformly distribute current flow on the surface of interconnect 208 and thereby minimize electrical interaction between the electrically asymmetrical current lug 242 and devices 24.

The current flow 189 proceeds in a smooth and uniform manner radially along sources 200 on to source interconnect 20 where current 189 from respective stages 214 and 216 merge on spokes 244. As can be seen, the current flow from any device 24 travels directly to source appendage interconnect 208 without passing by other devices 24, and thus does not affect and is not affected by the output of any other device, thereby assuring electrical symmetry. Current 189 flows smoothly from source interconnect 20 on to source appendage interconnect 208 which is disposed axially with respect to source interconnect 20, and thereafter along appendage interconnect 208 to lug 242. At the junction between interconnect 208 and lug 242, appendage interconnect 208 is substantially geometrically and electrically symmetrical with respect to both interconnect 20 and source 200 and, hence, with respect to respective devices 24. Current flow 189 along interconnect 208 is uniform and does not effect devices 24 thereby further assuring electrical symmetry. When current flow 189 reaches electrically asymmetrical lug 242, adverse current distribution patterns are often created; however devices 24 and drivers 26 are at sufficient electrical distance from lug 242 to be substantially electrically isolated therefrom. Examination of the characteristics of current flow 189 in the context of the source-drain configuration of FIGS. 1, 2 shows that any incremental IR drop from source to drain is substantially equal for all devices 24 and drivers 26, thereby assuring that device performance is determined by intrinsic device characteristics. More particularly, the cumulative IR drops, variable di/dt effects, and the consequent variable driving signal timing and magnitude and non-uniform current sharing of conventional converter design, such as shown in FIG. 5, are substantially eliminated. It should be noted that, as shown in FIG. 1, a coolant input port 56 and a coolant discharge port 58 occupy a portion of the perimeter of drains 12, 14 in the illustrated embodiment, thus limiting the distribution of flats (e.g., flats 51, 53, 55) to less than 360°. Any variation in current distribution caused by the unused portion of drain 12, 14 segment corresponding to ports 56, 58 is relatively minor and does not significantly affect electrical symmetry. A cutout 212 in source 200 suitably provides clearance for ports 56, 58.

Again referring to FIG. 2, voltage stages 214, 216 are biased positive and negative respectively. Appropriate driver output signals are applied to devices 24 on positive and negative drains 12 and 14 with proper signals to provide an AC output. However, stages 214, 216 may be both biased positive or negative and driven synchronously to provide a single ended output with paralleled current, e.g., a doubled current output. Furthermore, a second output stage of like construction may be attached at lug 242 and oppositely biased, and driven asynchronously with respect to the first output voltage stage to provide a single phase AC output with the same voltage but with twice the current output.

Referring again to FIG. 1, devices 24 may comprise plastic packaged or bare chips (sometimes called die) and may be connected to flats 46, 47, 49, 51, 53 and 55 of drains 12 and 14 by, e.g., solder or silver thermo-compression bonding to effect a uniform and high quality electrical, thermal and mechanical connection. Circuit boards 184 are suitably mounted to drains 12 and 14 by adhesives or other conventional means. Respective cutouts 194 may be provided in boards 184 to expose respective surfaces 192 of drains 12, 14. Cutouts 194 are employed to facilitate the placement of respective dielectric separating spacers 193 useful in the construction of a stacked high voltage assembly discussed in conjunction with FIG. 3.

The output stage 215 of FIGS. 1 and 2 illustrate a single stage element for the positive and negative voltage output stages. Best overall performance is currently obtained from MOSFETs rated at 500 V. With one stage element for each polarity, the output stage of FIGS. 1 and 2 would be suitable for 208 V three phase and 220 V single phase applications. For use in higher voltage applications such as 480 V, two or more stage elements may be employed for each voltage output stage. For use at a Utility 2,500 V service, approximately ten stage elements for each voltage output stage would be required. The construction of FIGS. 1 and 2 may serve as the basis for output stages with multiple stage elements.

Figure 3:
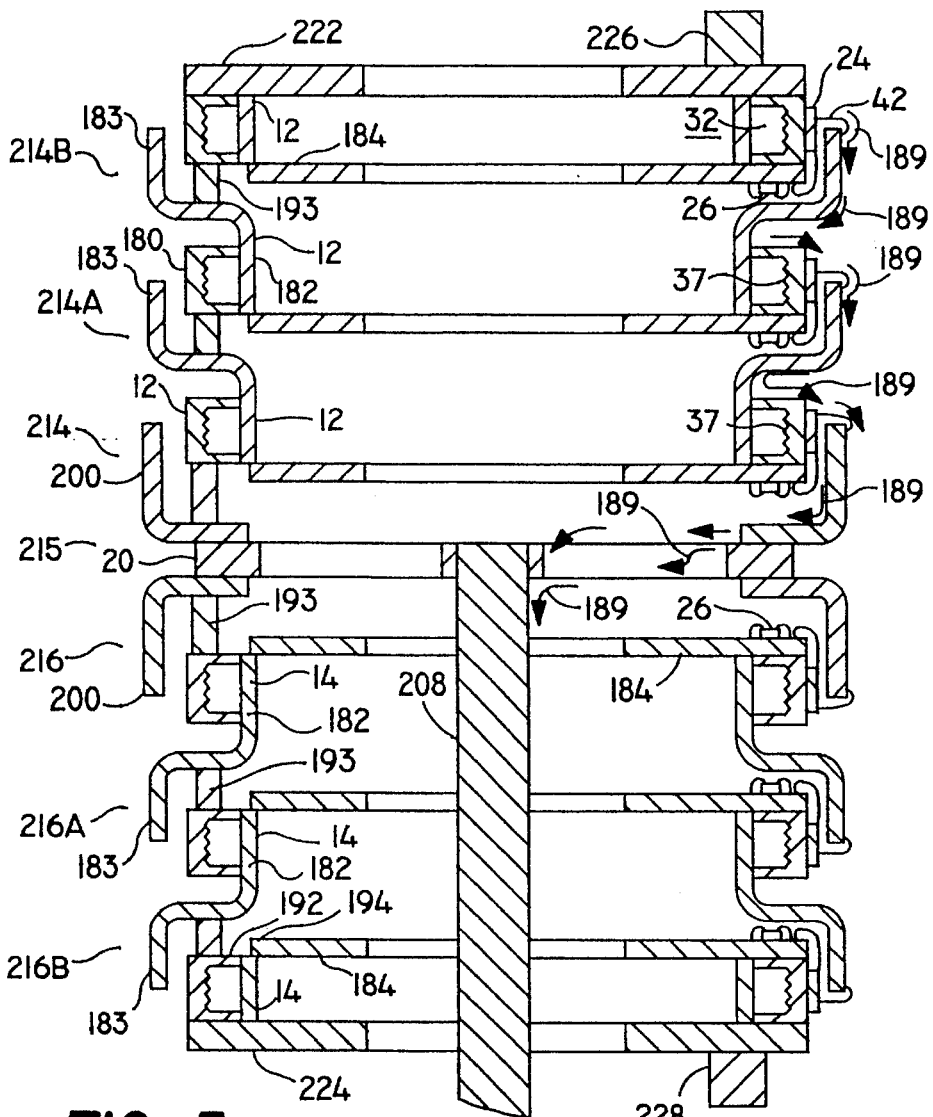
FIG. 3 is a cross section view of an extended embodiment of the output driver of FIG. 4.

Referring now to FIG. 3, an alternative embodiment of output stage 215 comprises positive and negative voltage stages each composed of three stage elements. More particularly, respective positive stage elements 214, 214A, 214B are progressively biased at higher positive voltages, and respective negative stage elements 216, 216A and 216B are progressively biased at increasing negative voltages. Circuit boards 184 are substantially the same as shown in FIG. 1 except that each board operates at the bias voltage of the respective stage element to which it is attached.

Figure 4:
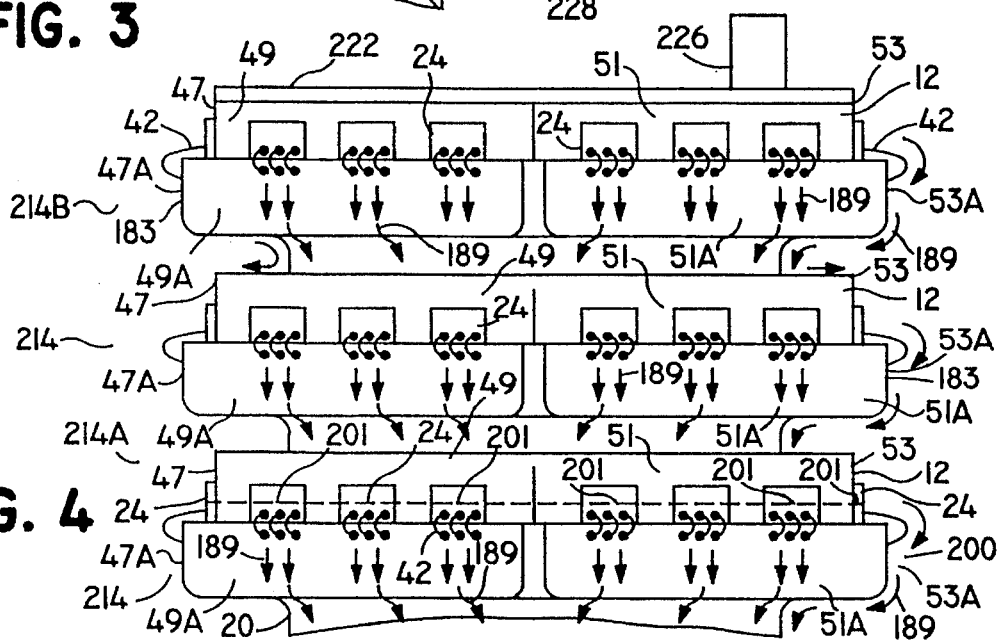
FIG. 4 is a partial front elevation view of an alternate embodiment of a circular symmetric, liquid cooled power output driver in accordance with the invention, illustrating two voltage stages each comprising three stage elements and the current flow orthogonal to the line of output devices.

FIGS. 3 and 4 illustrate adding (voltage seriesing) additional stage elements 214A, 214B and 216A, 216B to the single elements 214, 216 of FIGS. 1 and 2 to provide high voltage output. The flow characteristics of current 189 are substantially the same for the embodiments shown in FIGS. 1–4.

The partial perimeter (line) 201 (FIG. 4) of the line joining the centers of devices 24 on flats 46, 47, 49, 51, 53, 55 generally lies in a plane. In general all stage elements mount devices 24 in a similar manner. It is seen that although the flow vector of current 189 changes direction frequently as it flows from a stage element (e.g., element 214B) to source appendage interconnect 208, the current 189 flow vector remains approximately orthogonal to line 201 (see FIGS. 1–4), i.e., it rotates about line 201. Construction of stage elements 214, 216, source extension 20, and source appendage interconnect 208 are substantially identical to that of FIGS. 1 and 2. As previously shown, this construction is electrically symmetrical.

Figure 31:
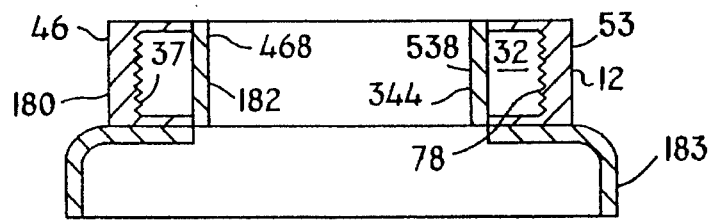
FIG. 31 is a cross section of a liquid cooled stage element illustrating the assembly of the liquid cooled drain with inside diameter and outside diameter external flats, including stamped source cup for series connections.

The construction of stage elements 214A, 214B and 216A and 216B (FIGS. 3–4) differs principally from 214, 216 (FIGS. 1–2) in that to facilitate voltage stacking, succeeding stage elements are attached from source to drain. To accomplish this in an electrically symmetrical and low cost manner, inner drain 182 extends axially and expands radially to become the source ring 183 for the next stage element as shown in FIG. 3. If internal flats 46B–55B are utilized for inside ring 182 to mount MOVs 230, then extruded tubing 344 (FIG. 31) with internal flats may be used, and source ring 183 may comprise a stamped cup (such as source 200) which may be soldered to the bottom of the outer ring 180 and inner ring 182 assembly, i.e., drains 12, 14. The dimensions of source rings 183 are comparable to source ring 200 (FIG. 2). This provides the proper radial spacing between devices 24 and the ID of ring 183 such that adequate electrical insulation results while yielding the shortest possible length of source lead wire 42. Cutouts (not shown) as in FIG. 1 are suitably provided in rings 183 to provide clearance for coolant connectors 56 and 58 (not shown) in all stage elements.

Dielectric spacers 193 which mount on drain surfaces 192 in board cutouts 194 (FIG. 1) are suitably configured to electrically isolate, center, and mechanically support elements 214, 214A, 214B and 216, 216A and 216B. Dielectric spacers 193 may be made from, for example plastic or ceramic, are suitably mounted with adhesive, solder etc. to elements 214, 216 and then successively to elements 214A, 214B and 216A and 216B. Respective positive and negative conductive plates 222 and 224, having respective electrical posts 226 and 228 connected thereto, are suitably attached to drains 214B, 216B for communicating with a DC input voltage source.

To provide for synchronous operation (FIG. 3) of positive elements 214, 214A and 214B, lines 188 which drive driver chips 26 on boards 184 are advantageously common. In like manner, drive lines 188 associated with negative elements 216, 216A and 216B are also tied together. Appropriate electrical control signals are then applied to respective drivers 26 to alternately drive the positive and negative elements to provide the high voltage AC output at source appendage interconnect 208. To provide for enhanced (e.g., doubling) current capability of output stage 215 (FIG. 3), the same procedure is employed as described above in connection with FIGS. 1 and 2. That is, both input voltage posts 226 and 228 are biased, e.g., positive. Thus all elements 214, 214A, 214B, 216, 216A and 216B are biased positive. Drive lines 188, for all elements are tied together thereby driving all chips 26 and 24 on all elements synchronously resulting in the positive segment of the AC wave form at the same voltage and twice the current. To provide the negative segment of the AC wave, a second output stage identical to the output stage shown in FIG. 3 is employed and biased negative. To provide the single phase AC output, the two output source appendage interconnects 208 of the two output stages are joined at source appendage interconnects 208 as shown in FIG. 27. Solid conductor source appendage interconnect 208 may be replaced by Litz wire cable.

The electrical symmetry of the multiple stage element construction of FIG. 3 is a direct extension of the single element construction discussed in conjunction with FIGS. 1 and 2. As can be seen, the generally circular symmetric construction provides a current path for each device such that there is no interaction with any other device. FIG. 4 provides a front elevational view of positive voltage stage 214 and stage elements 214, 214A, 214B to further illustrate the electrically symmetric characteristics of the present invention. Drains 12 of elements 214, 214A, 214B are shown with flats 49, 51 and associated devices 24 along with corresponding flats 49A, 51A of sources 183, 200. The electrically symmetric current flow 189 from extreme element 214B to source interconnect 20 may now be illustrated.

With continued reference to FIG. 3, the current path for a "column" of respective devices 24 will be described. With specific reference to the column of cross-sectional devices 24 in the upper-right hand portion of FIG. 3, current 189 flows from device 24 of stage element 214B, through source lead 42, to source 183 of element 214B. Current 189 then flows to drain 12 of element 214A and then through device 24 of element 214A, and thereafter stage element 214 in like manner. Current 189 then flows to source 200 where it flows to source interconnect 20 and then to source appendage interconnect 208 as described above in connection with FIGS. 1 and 2. Current flow for voltage stage 216 is similar to that described for voltage stage 214. Referring again to FIG. 4, the current flow described above in connection with FIG. 3 for a single column (i.e., the current traced through successive devices 24) is now illustrated for multiple paralleled devices (i.e., multiple columns) to demonstrate that the current flow from any one device does not interact with the current flow of any other device. As seen in FIG. 4 current flow 189 smoothly progresses from extreme stage element 214B to source interconnect 20. Current 189 from drain flat 51 of element 214B flows substantially to source flat 51A of element 214B and thence to drain flat 51 of element 214A and then to source flat 51A of element 214A where it then flows to drain flat 51 of element 214 and then to source flat 51A of source 200. From source 200 current 189 flows to source interconnect 20 which has the same wagon wheel/ spokes construction discussed above with reference to FIGS. 1 and 2. Current flow 189 down drain flats 46, 47, 49 53, 55 and source flats 46A, 47A, 49A, 53A of stage elements 214, 214A, 214B follow substantially the same pattern.

The design of FIGS. 1–4 provides substantial electrical symmetry. The current 189 flow from any column of paralleled devices 24 does not cross or merge, in any substantial manner, with the current flow from any other column of paralleled devices prior to converging at the appendage terminal or external connector where the current convergence is controlled and predetermined. All current paths, being substantially identical, have substantially identical impedances. The electrical symmetry resulting from the above ensures minimum device cross coupling and substantially uniform current sharing for best efficiency and maximum operating frequency.

Figures 6, 8:
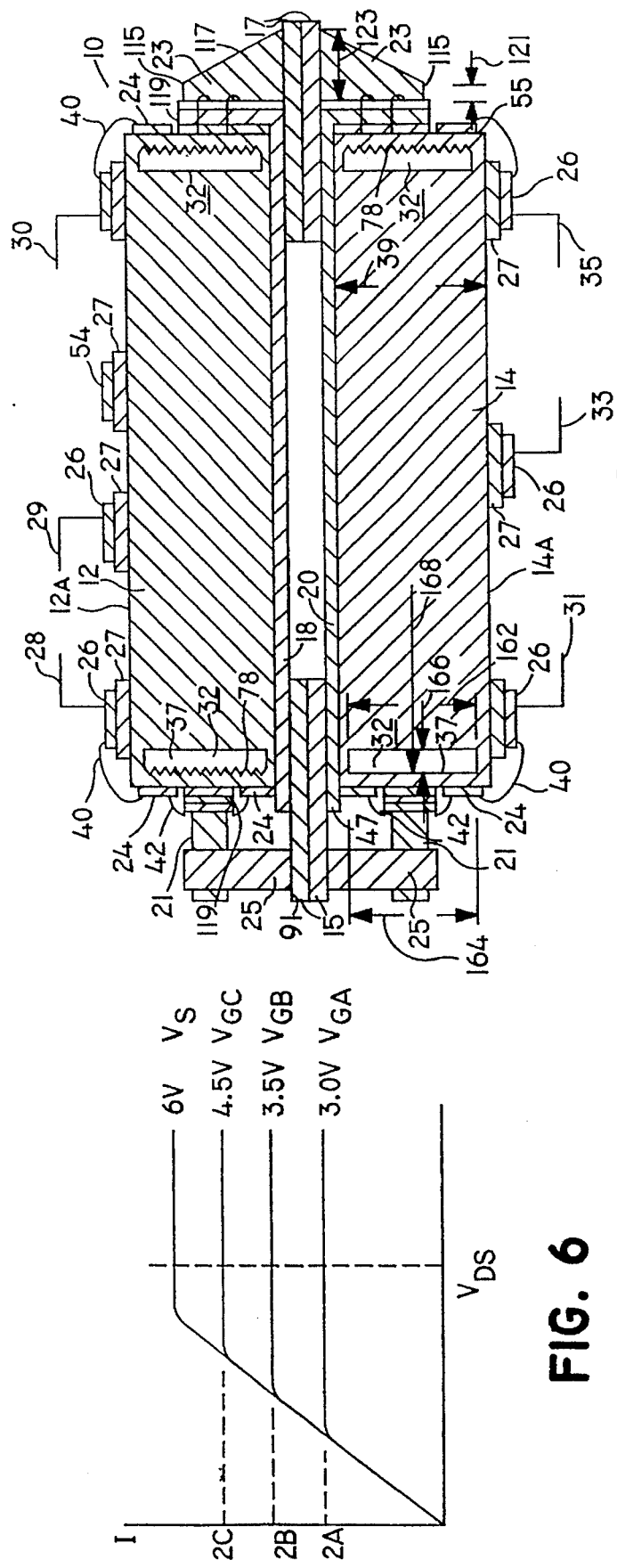
FIG. 6 is a device transfer function curve illustrating the effect of the asymmetrical electrical construction on device performance of the construction of FIG. 5.
FIG. 8 is a cross-section view taken along line VII—VII of the driver construction of FIG. 7 invention illustrating driver construction for three phase operation.
Figure 7:
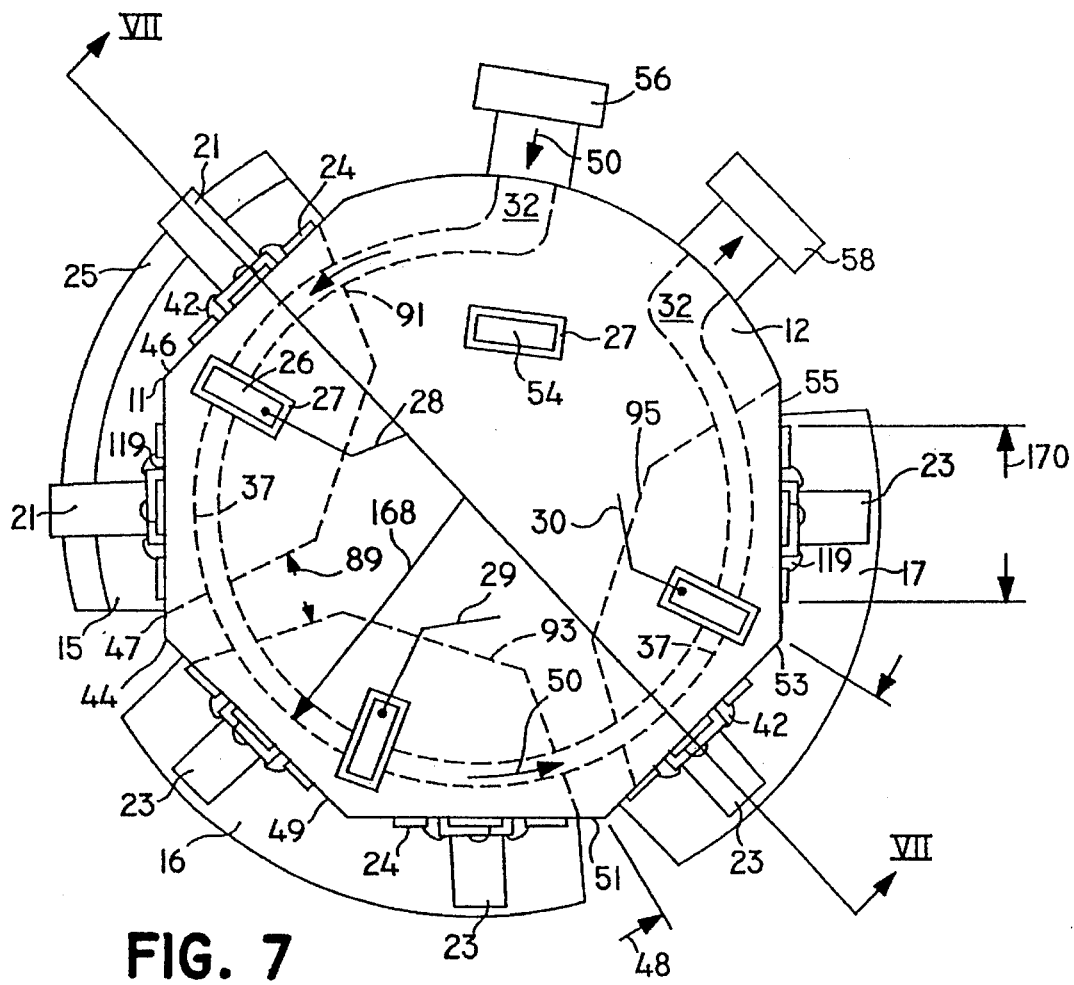
FIG. 7 is a top view of a liquid-cooled three-phase power output driver in accordance with the invention illustrating driver construction for three-phase operation.

Referring now to FIGS. 7 and 8, a preferred embodiment of the present invention is described in the context of a symmetric three phase inverter 10, as might be used in a motor drive. Inverter 10 suitably comprises: respective collective electrodes 12 and 14, e.g., positive collective drain 12 and negative collective drain 14; respective output electrodes for the output phases, e.g., a phase 1 source 15, a phase 2 source 16, and a phase 3 source 17; positive (18), and negative (20) drain electrical insulators; respective power devices 24 such as, e.g., power MOSFETs (at least one positive and one negative device for each phase); respective positive and negative driver chips 26 for each phase; and, respective positive (28, 29 and 30) and a negative (31, 33 and 35) drive lines for each phase. Divers 26 are interconnected with power devices 24 by respective gate leads 40. Power devices 24 are, in turn, connected to their associated sources 15, 16 and 17 by respective source leads 42. Drains and sources may be made of metals with suitable electrical, mechanical and thermal characteristics, such as Copper, Tungsten, Molybdenum, Beryllium and dispersion hardened coppers including Cu-Cr.

Drains 12 and 14 are generally cylindrical, but preferably manifest a peripheral surface 44 including respective flats 46, 47, 49, 51, 53 and 55 of predetermined height 39 (FIG. 7) and width 48 (FIG. 8). The flats facilitate mounting of power devices 24. The number of flats employed is determined by such factors as drain dimensions, device dimensions, required performance, etc. and may comprise more or less flats than illustrated. In general, flat width 48 is at least that of one device 24, and preferably large enough to accommodate multiple devices; flat height 39 is suitably equal to the full extent of the drain. Drains 12 and 14 each comprise a peripheral circumferential coolant conduit 32 having a heat exchange surface 37. As best seen in FIG. 8, coolant conduit 32 is connected to a coolant input fitting 56 and coolant discharge fitting 58. Although a circular construction is illustrated, different shapes (e.g., elliptical) may suitably be employed, generally conforming to the active portion of peripheral surface 44 whereupon respective devices 24 are mounted. Conduit 32 is suitable of a predetermined width 162 (axially relative to the drain) and height 166 (radially relative to the drain).

Respective source 15, 16 and 17, each suitably comprise respective flat conductive plates 91, 93 and 95 extending radially outward beyond peripheral surface 44 of drains 12 and 14, and an extension, e.g., one of respective extensions 21, 23, of predetermined geometry to facilitate interconnection to power devices 24 (discussed below), extending axially from each plate 91–95 at a juncture 117 to a tip 115. Respective plates 91–95 are electrically isolated from drains 12 and 14 by, e.g., insulators 18 and 20 interposed between the plate and each of drains 12 and 14, respectively. As best seen in FIG. 8, each plate 91, 93 and 95 is generally centered about a juncture 11 between respective flats, and underlies the majority of those flats, while maintaining a minimum physical separation 89 from adjacent plates to ensure adequate electrical isolation between output electrodes.

To facilitate manufacture, each source 15, 16 and 17 may be formed of an upper plate attached to positive drain insulator 18, and a lower plate attached to negative drain insulator 20. In this manner, the positive and negative drain subassemblies may be independently manufacture and tested and then joined together with each set of upper and lower source plates electrically in common upon assembly. The positive and negative sub-assemblies may be identical and interchangeable to reduce manufacturing costs. Preferably, all drains are of the same size and geometry, and if only one size power device 24 is employed, preferably the same number of devices are mounted on each drain.

Each output phase has associated therewith one of source electrodes 15, 16 and 17, a positive driver device 26 associated with positive drain 12; a negative driver device 26 associated with negative drain 14; a positive set of power devices 24 associated with positive drain 12 and electrically interconnected to operate in parallel; a negative set of power devices 24 associated with negative drain 14, an output electrode and, if desired, one or more snubber resistors 54. The portion of one of plates 91–93 of the source electrode for an output phase defines that portion of peripheral surface 44 of each of drains 12 and 14 associated with that phase. The plurality of power devices 24 associated with a particular phase are suitably mounted on the portion of peripheral surface 44 corresponding to that plate, in thermal communication with the appropriate drain (i.e., drain 12 or drain 14) and with the drain pad (not shown) of each individual device electrically connected to the drain upon which it is mounted. In the embodiment of FIGS. 7 and 8, sets of two flats are associated with each phase, and the power device 24 associated with the phase one mounted on those flats: flats 46 and 47 with phase 1; flats 49 and 51 with phase 2; and flats 53 and 55 with phase 3. The respective individual positive power devices 24 associated with a particular phase are mounted on positive collective drain 12 and operate in parallel, electrically connected to an associated positive driver chip 26 and to the associated source electrode. Each positive driver chip 26 is suitably mounted, on an insulation pad 27 interposed between the driver and the outer surface 12A of collective drain 12, proximate peripheral surface 44 towards the center of the area defined by its corresponding one of plates 91–95. The negative power devices 24 associated with a particular phase are similarly mounted on corresponding flats on negative composite drain 14, and similarly connected to a negative driver chip 26 disposed on the outer surface 14A of negative drain 14. Control signals are applied to the positive driver chips 26 through control lines 28, 29 and 30, and to negative driver chips 26 through control lines 31, 33 and 35.

Conduit 32 provides for cooling of power devices 24, to facilitate high power, high frequency operation. Referring again to FIG. 8, a continuous stream of coolant 50 is supplied to coolant input port 56 from a closed or open loop heat exchange system (not shown). Because of the electrical biasing of drains 12 and 14, coolant 50 is preferably a dielectric, such as a fluorocarbon. This tends to eliminate complications related to coolant electrical conductivity, such as electrolysis problems and the need to electrically isolate the coolant from the positive (12) and negative (14) drains.

The operation of the three phase inverter (FIGS. 7 and 8) involves the proper switching sequence of devices 24 associated with respective output phases 15, 16 and 17. The positively and negatively biased devices 24 on drains 12 and 14, respectively, associated with respective output phases 15, 16 and 17 are alternately turned off and on thereby generating the AC output for each phase, with each respective output phase being spaced 120° apart from each other.

Referring to FIG. 7, conduit width 162 is generally at least equal to the length of the 164 of devices 24 on flats 46, 47, 49, 51, 53 and 55. Conduit height 166 is determined by the fluid volume flow rate needed to remove the peak heat flux from heat exchange surface 37, i.e., the coolant velocity and the desired coolant bulk temperature rise. Conduit height 166 generally ranges from 0.2 mm to 6 min. The width 170 of a row (FIG. 8) of devices 24 on a particular flat is largely constrained by the width 48 of the flat.

Cooling of power devices 24 is accomplished by the flow of coolant 50 in conduit 32. Heat generated in driver chips 26 or snubber resistors 54 may be conductively transmitted through insulators 27 and drains 12, 14 to coolant conduit 32. Inasmuch as conduit 32 is curved (e.g., circular), the flow of coolant 50 therethrough generates a centrifugal force $q=v2/r$ $a=v2/r$ against the heat exchange surface 37, where v is the velocity of coolant 50 and r is the radius of curvature 168 of surface 37 of conduit 32 opposing devices 24. The centrifugal force generated accelerates the creation and removal of nucleate bubbles from heat exchange surface 37, thereby significantly enhancing heat transfer.

Figure 9:
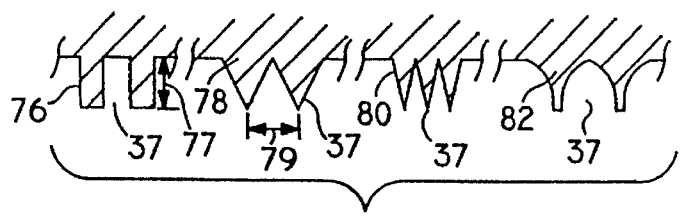
FIG. 9 illustrates various geometries for the liquid cooled heat exchange surfaces of FIG. 7.

To further enhance heat transfer, extended surfaces may be employed on heat exchange surface 37 of conduit 32. With momentary reference to FIG. 9, alternate exemplary extended surface cross sections may comprise, for example, rectangles 76, triangles 78, right angle triangles 80, curves 82 or any combination of the foregoing. For purposes of illustration, triangular 78 extended heat exchange surfaces are shown in FIG. 7. Extended surface geometries 76, 78, 80 and 82 generally exhibit heights 77 ranging from 0.2 mm to 3 mm and pitches 79 ranging from 0.5 mm to 5 min.

Figure 10:
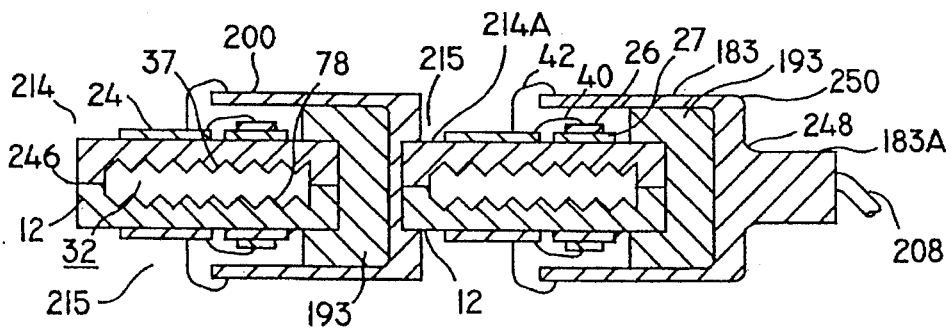
FIG. 10 is a cross section view, taken along line X—X of the linear embodiment shown in FIG. 12.
Figure 12:
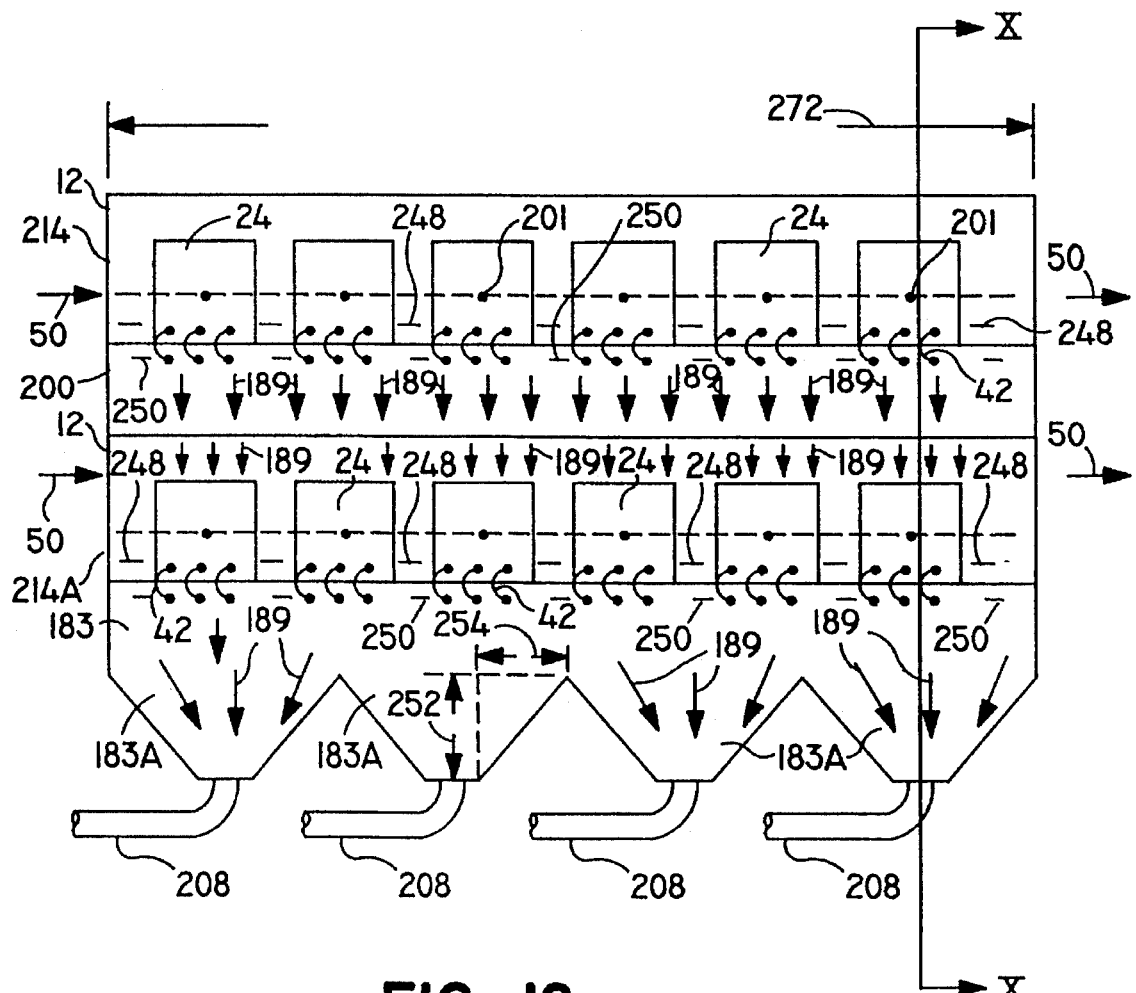
FIG. 12 is a top view of an alternate topology in accordance with the present invention, comprising two stage elements wherein the output of the devices on opposing surfaces of each stage are connected in parallel and the two stage elements are voltage seriesed to illustrate device placement and current flow characteristics.

Referring now to FIGS. 10 and 12, an alternative rectangular embodiment of output stage 215 suitably comprises respective stage elements 214, 223 connected in series for high voltage output. Linear drain length 272 (FIG. 12) may be any desired value. The configuration of conduit 32 and respective fins 78 is substantially as described in connection with FIGS. 7, 8. Drain 12 in element 214 (FIG. 10) may comprise two extruded pieces bonded together, e.g., soldered, along seams 246 to hermetically enclose conduit 32. Drain 12 in element 223 is alternatively illustrated as a single extrusion. Liquid coolant 50 flows through linear conduit 32 to remove heat generated by devices 24 and drivers 26.

As previously described, each device 24 is bonded to a drain 12 for intimate electrical and thermal contact therewith. Drivers 26, mounted on insulators 27, may also be mounted on drain 12 in the embodiment of FIGS. 10 and 12. Source lead wires 42 electrically connect devices 24 to respective sources 200, 183, and gate wires 40 connect drivers 26 to devices 24. Drain 12 of element 223 is electrically and mechanically fastened to source 200 to provide voltage seriesing of elements 214 and 223, e.g., a doubling of the voltage. Respective insulators 193 provide electrical insulation between source and drain.

With continued reference to FIG. 10, respective radiused inside corners 248 and outside corners 250 of all surfaces subject to high sheet currents 189 are advantageously rounded to minimize reflections rising from the fast rise and fall times of high frequency signals or fast switching devices. The radius selected should be such that the field gradient at a corner, inside or outside, is beneficially limited to no more than twice that of the plane or curved surfaces for the various embodiments described herein. This design criteria applies to all embodiments of the present invention described herein.

Source lead wires 42 interconnect devices 24 to sources 200, 183. Multiple source lead wires 42, employed to reduce inductance, are joined along a line 248 on devices 24, and in like manner the wires 42 also join along a line 250 on sources 200, 183. Substantially uniform length of source lead wires 42 provides for substantially uniform electrical characteristics, i.e., inductance and resistance. In general, substantially uniform length of source lead wires 42 is employed in all embodiments of the present invention described herein.

To facilitate the connection of source 183 to an output appendage interconnect (not shown in FIGS. 10 and 12), respective tapered sources 183A are provided to maintain compact size. To maintain electrical symmetry, the rate of increase of current density, as determined by the convergence rate of the conductive surface of source 183A, is advantageously less than a critical rate to prevent significant mutual device cross coupling. Hence, the ratio of length 252 to width 254 of tapered source 183A is desirously no less than 1 to 1 and preferably at least 1.5:1 to 2:1 (that is, the length 252 is greater than the width 254). Respective source appendage interconnects 208, which are mounted at the apex of the converging segments of respective sources 183A, may be made of Litz wire. All Litz wire inserts are preferably the same length; those disposed the shortest distance from the common lug or plug may be looped to take up the extra length.

Figure 11:
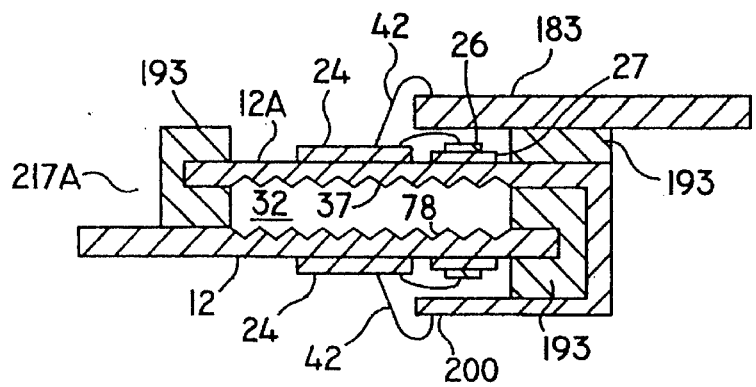
FIG. 11 is a cross section view of an alternate embodiment of a linear, liquid cooled stage element wherein opposing insulated surfaces are biased at different voltages for voltage seriesed operation.

Referring now to FIG. 11, an alternative embodiment of a linear output stage 217A, similar to that of FIG. 10, incorporates two elements in a single cooling structure. Drain 12 and associated devices 24 are interconnected to source 200. To create a voltage series construction, source 200 is illustratively U-shaped, forming a 180 bend and extending continuously to become drain 12A opposing drain 12. Source 200 and drain 12A may thus be of unitary construction (one piece). Insulators 193 form the remaining two side walls of conduit 32. Additional stages 217A may be seriesed by joining source 183 to drain 12 of the next element. When so seriesed, source 183 is rectangular and does not have tapered segments 183A (FIG. 12) until the final element.

The electrically symmetric construction of FIGS. 10, 11, 12 may be seen by tracing the flow of current 189 from drain 12 of element 214 to respective source appendage interconnects 208 as follows. With continued reference to FIGS. 10 and 12, current 189 from devices 24 (at the top of FIG. 12) flows through multiple parallel source wires 42 to source 200. The current vectors flowing from each of the several devices 24 are parallel to one another across source 200 and orthogonal to a line 201 extending through the centers of respective devices 24. Current 189 thereafter flows from source 200 to drain 12 of element 214A which is in substantially continuous mechanical and electrical contact along with source 200 length 272 thereof. Current 189 then flows to devices 24 on drain 12 of element 214A and then out multiple parallel source leads 42 and onto source 183. The parallel flow of current 189 crosses source 183 until it reaches tapered source segments 183A where it smoothly and uniformly converges to respective source appendage interconnects 208.

Referring again to FIG. 12, line 201 joins the centers of devices 24 on drains 12. It is seen that the current flow 189 from source 12 of stage element 214 through element 214A to source 183 is generally orthogonal to line 201 in a manner similar to that described for FIGS. 1–4. At sources 183A, there is a smooth convergence, though still generally orthogonal, i.e., on average, of current flow 189 to source appendage interconnects 208.

The design shown in FIGS. 10–12 thus meets the criteria for electrical symmetry; the current 189 flow from any column of paralleled devices 24 does not cross or merge, in any substantial manner, with the current flow from any of the other columns of paralleled devices prior to converging at the appendage terminal or external connector where the current convergence (or divergence at the drain) is controlled and predetermined. Moreover, all current paths, being substantially identical, have substantially equal impedances. The electrical symmetry resulting from the above ensures minimum device cross coupling and substantially uniform current sharing for maximum efficiency and operating frequency.

Figure 13:
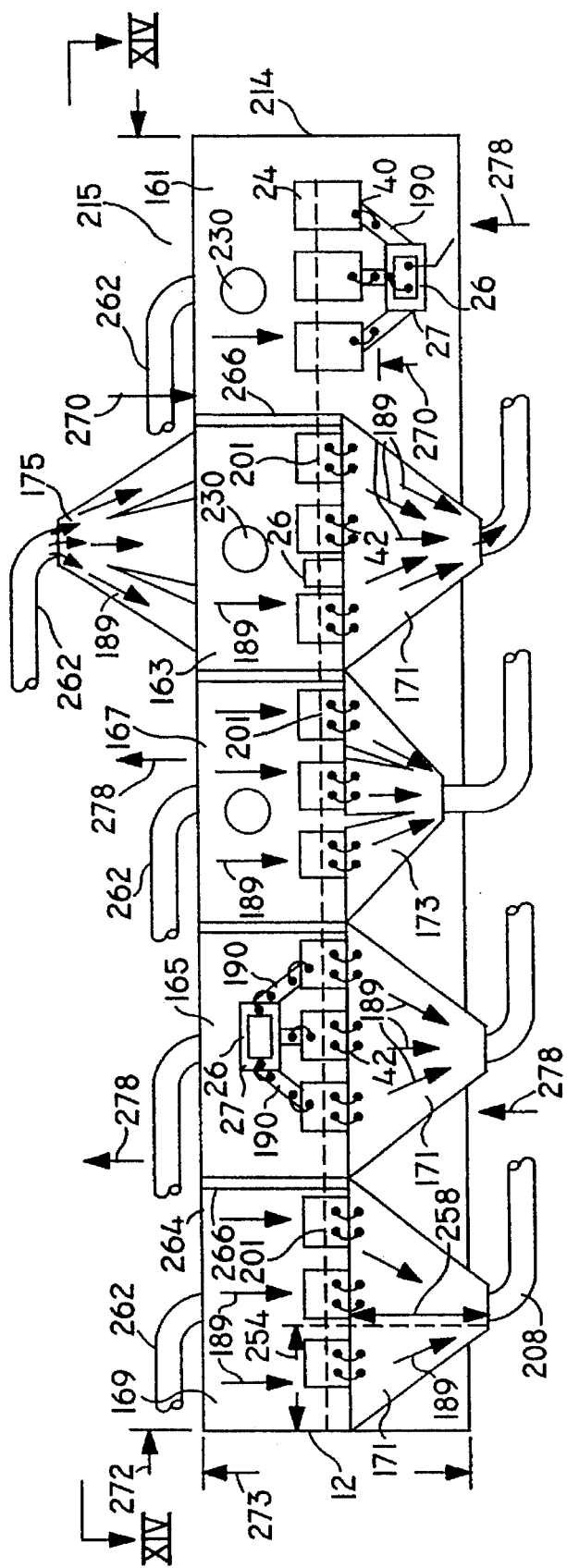
FIG. 13 is a top view of a linear air cooled stage element, employing a single tow of devices, in accordance with the present invention.

Referring now to FIG. 13, an alternate embodiment of voltage stage 215 is configured as a linear electrically symmetrical air cooled voltage stage comprising drain 12, for example a copper plate upon which are mounted devices 24 in a manner such that the centers of devices 24 are disposed proximate to a line 201. Line 201 is preferably parallel to the axial length 272 of drain 12. Respective sources 171, 173 may be made of multiple tapered segments. All sources 171, 173 are electrically tied together for single ended use. Use of individual source segments 171, 173 enables simpler assembly. Driver device 26 and interconnect 190 are suitably configured to function in substantially the same manner as described in connection with FIG. 1 as shown in drain segments 161, 165. In the exemplary embodiment shown in FIG. 13, drain 12 is suitably divided into a plurality of clusters (e.g., five), for example respective dusters 161, 163, 165, 167 and 169. Each cluster here comprises three devices 24 driven by a driver device 26. In duster 161 of drain 12 source element, a portion of source segment 171 is removed to show construction. In duster 165 driver 26 is on the other side of the line 201 of devices 24 in contrast to cluster 161. If driver 26 only drives two devices 24, it may be suitably placed between the two devices 24 as shown in duster 163 for minimal lead inductance. Alternatively, individual driver boards 446 as described in connection with FIG. 37 may be employed for clusters, 161, 163, 165, 167 and 169.

Figure 16:
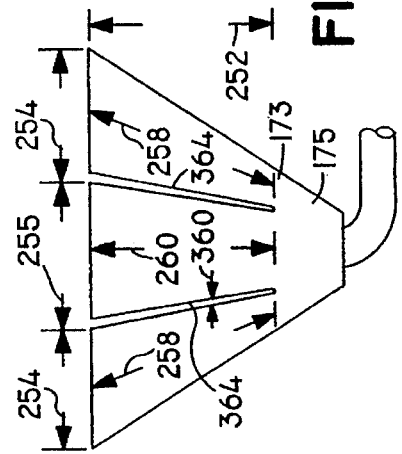
FIG. 16 is an exemplary slotted source element.

Source segments 171, 173 are smoothly tapered to receive a source appendage interconnect 208, e.g., Litz wire. To maintain electrical symmetry, length 252 of source segment 171, 173 is suitably at least equal to width 254, and preferably at least about 1.5 to 2 times larger, to minimize reflections. To reduce the size of source segment 171, it may be slit as shown in source segment 173 (FIGS. 13, 16). Though source segment 173 (FIG. 16) is shown slit in two places, more slits may be employed. These same design considerations may also be applied to the three legs 258, 260 of source segment 173, that is, the lengths 258, 260 is suitably at least 1.5 to 2 times larger than widths 254 and 255 respectively. The impedance of the three legs 258, 260 should be substantially equal. Legs 258 on either side of leg 260 are desirably of the same dimensions. Leg 260 is shorter than legs 255 and therefore the width 254 of leg 260 should be appropriately less than width 254 of legs 258 to obtain equal impedance in all three legs. This design criteria also applies to tapered drain segment 175. To further enhance the current carrying capabilities of slit segments 171, 173 and 175, they may be fabricated and fastened to sources or drains in a similar manner to the multiple slotted and insulated sheet appendage interconnects of FIGS. 28 and 29. In general, metal thickness should be at least twice the skin current depth for all conductors described herein. The width of slot 364 may range from 0.1 to 10 times that of the thickness of segments 171, 173 and 175.

With continued reference to FIG. 13, respective multiple appendage interconnects 262 (e.g., Litz wire) are attached periodically along the side 264 of drain 12 substantially parallel to line 201 joining centers of device 24 to facilitate uniform input current distribution to drain 12. To assist in confining current flow 189, slots 266 of narrow width, e.g., 0.3 mm, and a suitable depth 268 (FIG. 14) of about 10% to 80% that of the thickness of drain 12 are placed approximately midway between drain leads 262 and extend 270 (FIG. 13) slightly beyond devices 24. Slots 266 also serve to provide partial high frequency isolation of adjacent clusters 161, 163, 165, 167 and 169. Slots 266 may be advantageously employed in all embodiments, including radial slots for circular symmetric configurations, for example in the context of the embodiments shown in FIGS. 1, 8, 19 and 43. Alternatively, tapered drain segments 175 may be employed to provide uniform current distribution across drain 12. Surge protection devices 230 such as MOVs or diodes may be mounted on drains 12 in close proximity to devices 24 and source segments 171, and 173.

Figure 14:
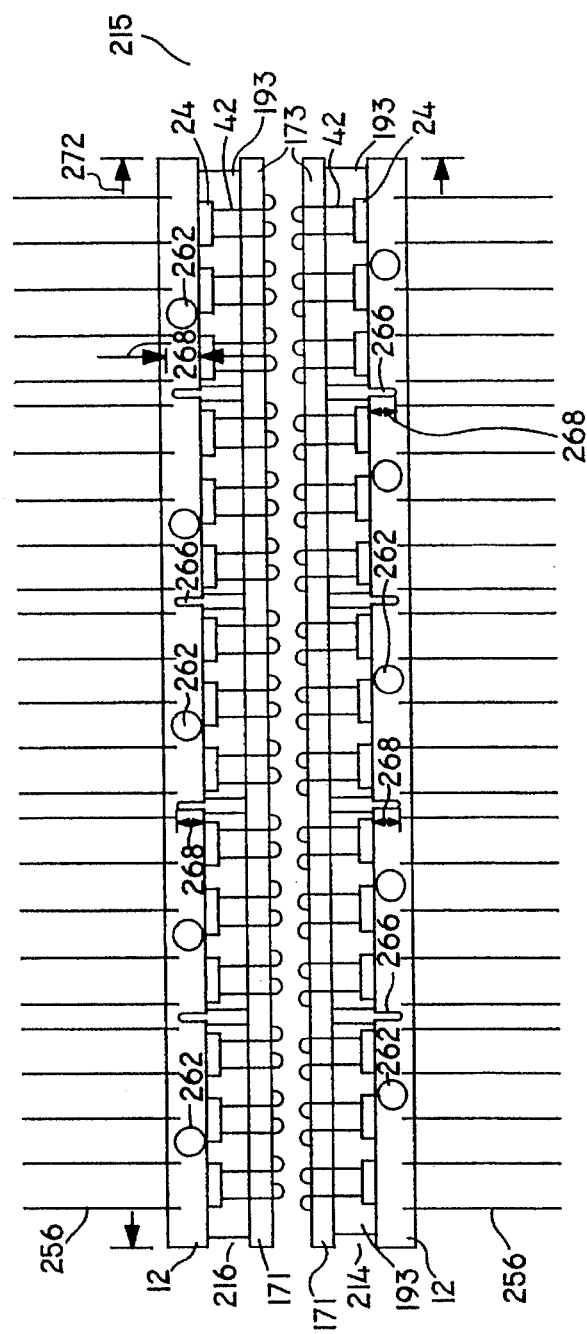
FIG. 14 is an extended rear end view taken along line XIV—XIV of the linear air cooled stage elements of FIG. 13, augmented with a second, opposing stage element.

Referring now to FIG. 14, element 214 of FIG. 13 is shown rotated 90° about line 201 (top of FIG. 13 rotated toward the reader); an additional, complimentary element 216 is also shown disposed opposite element 214. If desired, elements 214, 216 may be connected as a single phase output stage, or they may be seriesed to double the output voltage or paralleled to double the current output while operating single ended, i.e., either positively or negatively biased as a voltage output stage with another similar oppositely biased voltage output stage employed to provide single phase output. For three phase output, three of output stages 215 operating 120° out of phase with each other would be employed as shown in FIG. 25.

Figure 15:
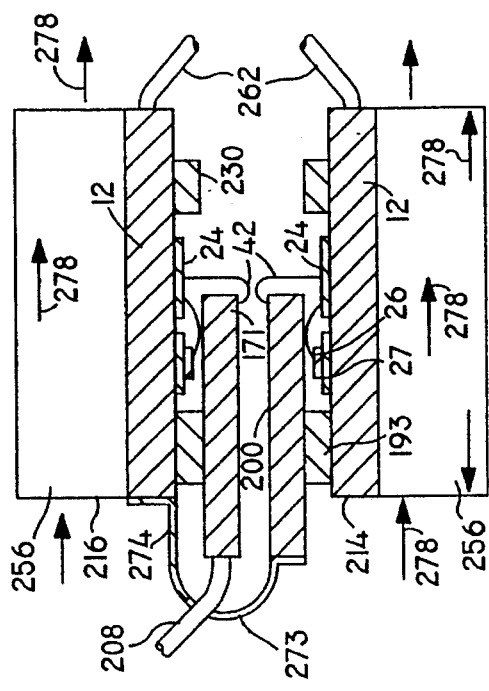
FIG. 15 is a cross section view of two interconnected linear air cooled elements of FIG. 14.

Cooling of output stage 215 of FIGS. 13–15 is accomplished by urging air 278 through and thereby removing heat from respective fins 256. To enhance efficiency, the thickness of the fins 256 may range from 0.1 mm to 2 mm and the spacing between fins may range from equal to the fin thickness to 5 times the fin thickness, and the height of each fin 256 is suitably about 20 to 90 times the fin thickness. In a particularly preferred embodiment, fins 256 are 1 mm (0.040") thick, spaced 1 mm (0.040") apart, and are 50 mm (2") high. Fins 256 are positioned 1 mm (0.04") apart along the length 272 of drain 12 (FIG. 13) and extend the width 273 of drain 12 (FIG. 15). The planes of fins 256 are substantially orthogonal to the line 201 joining the centers of devices 24. Drains 12, suitably made from copper, may be advantageously provided with slots for fins 256 to be soldered or brazed into for strong and low thermal resistant joints.

Respective stage elements 214, 216 (FIG. 14) are advantageously positioned with fins 256 of element 214 extending upwardly and fins 256 of element 216 extending downwardly, and with devices 24 facing each other. This construction allows for the convenient, low impedance interconnection output stages 214 and 216 for series or parallel connections by providing a short conductive bridge interconnecting elements 214 and 216, as described below in connection with FIG. 15. Streamlined shrouding 308 (see FIG. 25) may be positioned to cover the area between drains 12 including devices 24 and sources 171 and 173 of elements 214, 216. This then directs substantially all the air flow, for example from a fan used to cool the apparatus to fins 256 on elements 214, 215. The shroud may be provided with suitable apertures to allow predetermined air flow for any required cooling of sources 171 and 173 etc. in the shroud covered region.

With continued reference to FIGS. 13–15, interconnection between elements 214, 216 may be made as follows. For use as a voltage output stage, i.e., single phase AC output, drain leads 262 of element 214 are biased positive and drain leads 262 of element 216 are biased negative. Respective source appendage interconnects 208 of both elements 214, 216 are tied together at a single connector. To maintain uniform impedance, the wire length of all output appendage interconnects are suitably equal. Appropriate driver output signals are alternately applied to drives 24 on positive and negative drains 12 and 14 to provide an AC output. For paralleled output, i.e., to double the current, all leads 262 for both elements are tied together, i.e., all are biased positive or negative, and the source appendage interconnects 208 are tied together.

To effect series connection of elements 214, 216 (FIG. 15), conductive source extension 274 suitably interconnects source 200 on element 214 with drain 12 of element 216. In a series configuration, source 200 of element 214 is advantageously of rectangular shape for a simpler and a more efficient interconnecting configuration. In accordance with one aspect of the illustrated embodiment, source extension 274 comprises a series of voids or slots 273 which provide clearance for source appendage interconnects 208. Clearance slots 273 are provided for each of source appendage interconnects 208.

Source extension 274 suitably comprises an elongated, curved sheet of thin metal, e.g., 0.5 mm Copper, that extends substantially the length 272 of drain 12. Air flow 278 is generally parallel to fins 256 and drains 12. Alternatively, one stage element, e.g. element 216, may be rotated 180° such that drain input interconnect 262 are now on opposing sides. In this configuration source extension 274 does not require clearance slot 273 since source output 208 is now on the opposing side and is not obstructed as previously with source extension 274.

Referring again to FIG. 13 and cluster 163, current 189 flow from drain input wires 262 across drain input 175 and drain 12, through devices 24 and across source elements 171, 173 is seen to be generally orthogonal, on average, to line 201 joining centers of devices 24 thus providing uniform impedance between devices 24 and source appendage interconnects 208. The configurations illustrated in FIGS. 13–15 thus meet the criteria for electrical symmetry: the current flow 189 from any of the paralleled devices 24 does not cross or merge, in any substantial manner, with the current flow from any of the other paralleled devices prior to converging at the appendage terminal or external connector where the current convergence (or divergence at the drain) is controlled and predetermined. All current paths, being substantially identical, have substantially equal impedances, and, thus, each device 24 sees the same impedance. The electrical symmetry resulting from the above-described configuration ensures minimum device cross coupling and substantially uniform current sharing for maximum efficiency and operating frequency.

Figure 30:
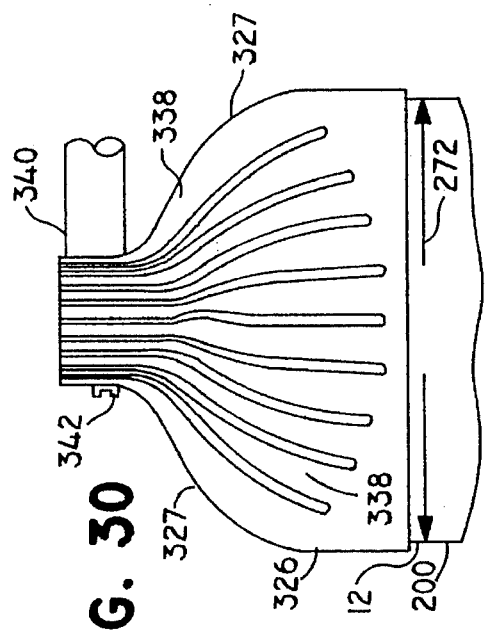
FIG. 30 is multiple slotted and insulated sheet appendage interconnect flexed and twisted to join at a common connection.
Figure 29:
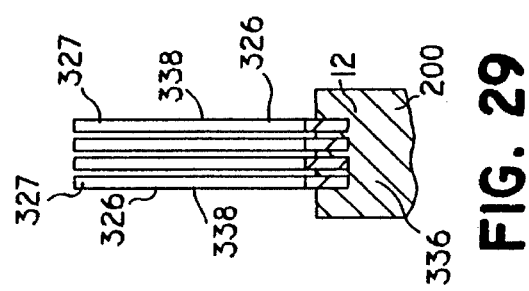
FIG. 29 is a cross section view of multiple slotted sheet appendage interconnect configured for connection to a drain or source.
Figure 28:
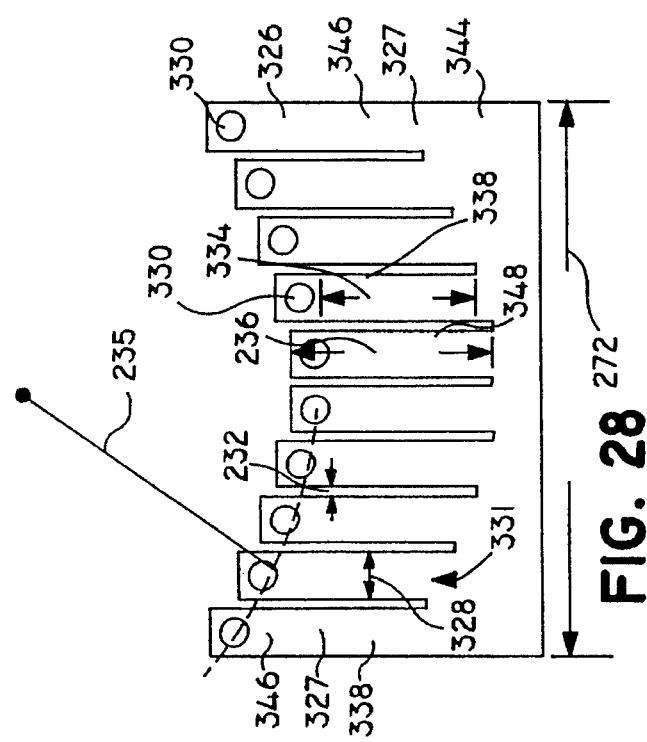
FIG. 28 is a top view of a slotted sheet appendage interconnect.

An alternate design for an appendage interconnect for air or liquid cooled linear stage elements is shown in FIGS. 28, 29, 30 employing multiple paralleled and insulated slit sheet conductors. Referring now to FIG. 28, a slit sheet conductor 326, made of a suitable material, e.g., copper, copper alloys, aluminum, or the like, comprises alternating slits 232 and fingers 327. The thickness of sheet 326 may range from about 0.05 mm (0.002") to 2 mm (0.080"), with typical thicknesses being from 0.1 mm (0.004") to 0.4 mm (0.016"). In general, sheet thickness is desirably at least twice the skin current depth. The width of each slit 232 is suitably at least equal to the thickness of sheet 326 and preferably more than one and a half times to two times greater. The length 236 of each finger 327 is desirably at least three to five times, or more, than that of the sheet thickness. The length 236 of each finger 327 is substantially the same for all fingers. However, finger lengths may vary if finger widths 328 are adjusted to maintain constant impedance. The length 272 of sheet 326 is substantially the length 272 of the source 12 or drain 200 (FIGS. 12, 13, 17, 19, 21, 22) to which sheet 326 is attached. However, multiple lengths of sheet 326 may be employed in parallel to span drain or source length 272. The width 328 of finger 237 may be optimized with respect to the length 236 to accommodate the flexing and twisting required to bring all the holes 330 of fingers 327 into concentric registration, as seen in FIG. 30.

Respective screw clearance holes 330 are provided at the distant end of each finger 327. Both sides of sheet 326 are suitably coated with a thin insulating material 338 over length 334 of fingers 327. The edge of sheet 326 opposite holes 330, as well as the surfaces of sheet 326 in the vicinity of holes 330, are suitably without an insulating coating. The centers of clearance holes 330 are of uniform placement in close proximity to the extreme edges of fingers 327, and describe an approximate arc of radius 235. The base of fingers 327 also define an arc. Sheet 326 may be manufactured by, for example, chemical milling or stamping.

Rectangular sources (e.g., source 200) and drains (e.g., drain 12) may be provided with a slot 336 (FIG. 29), which extends substantially the length 272 of the drain or source, for the insertion of multiple (e.g., four) sheets 326. The bases of sheets 326 are suitably soldered into slot 336, the solder only wetting the base of the sheets 326 with the insulation preventing the solder from wetting the fingers 327. Thus, the layers of sheets 326 are in close proximity to each other and the fingers 327 of each layer of sheets 326 are free to move independently and are electrically insulated from each other. With four layers of sheets 326 there is, in effect, four times the surface area and thus four times the high frequency current carrying capacity of a single sheet. The uniform finger dimensions provides uniform impedance which, when combined with uniform current flow from or to sources and drains, over the lengths 272 of the sources and drains, maintains electrical symmetry.

Respective fingers 327 (FIGS. 28–29) are suitably manipulated (bent) such that respective holes 330 are aligned in succession to facilitate the journalling of a connector 340 thereunto. Referring now to FIG. 30, an input (or output) connector 340 which is drilled and taped at its center to accommodate a screw 342. Fingers 327 of the layers of sheets 326 are now twisted 90° to bring all holes 330 of fingers 327 over the threaded hole in connector 340. Adjacent fingers 327 may be alternately twisted 90° to the right and then to the left to substantially cancel out inductance. Since extreme fingers 327 must travel further than the center finger to join at the center, the arc defined by approximate radius 235 provides the geometry needed for all fingers to join. Another arc defines the base of fingers 327 to maintain a substantially constant finger length 236. Insulation 338 on the external surfaces and sides of fingers 327 prevents shorting between fingers. The width 328 and length 236 of fingers 327 are designed to minimize the stresses related to the 90° twisting of fingers 327. Screw 342 which passes through all holes 330 then clamps the fingers 327 to a common electrical junction on connecter 340 upon being screwed in. Since insulation 338 did not extend to the region around the holes 330, excellent electrical contact is made. The connector 340 to finger 327 junction at holes 330 may now be soldered. The results are the same when used with a drain except the current is flowing in the reverse direction.

In an alternate embodiment, strips of sheet conductor, e.g., copper, generally analogous to finger 327 may be employed instead of connector 340. Like fingers 327, the copper sheets may be insulated on all surfaces except at each end which may have a screw clearance hole corresponding to hole 330 of finger 327 for interconnect purposes. The strip sheet may then be interleaved with fingers 327 and bolted together with screw 342 to form good electrical contact. The sheet strips being separate from each other may now twist and flex while extending to a fixed electrical connection. The multiple insulated parallel sheet strips provide a low inductance, high current path. The same construction may be applied to multiple parallel insulated strip tapered source interconnects 171, 173 and 175. It is seen that multiple paralleled slotted and insulated sheet conductors 326 provide an electrically symmetric transition medium from an elongated current source (source 183 or 200) to a point connection as exemplified by connector 340.

Referring now to FIG. 32, an alternative embodiment of an air cooled linear output stage 215 incorporates multiple paralleled and insulated slit sheet conductors 326 for both input appendage interconnect to drain 12, and for output appendage interconnect from source 200. Source 200 is suitably rectangular and prepared with a nesting slot 336 for receiving multiple sheets 326, as shown and described in connection with FIG. 29. Sheets 326 extend substantially the length 272 of source 200. In like manner, drain 12 is prepared with slot 336 for receiving multiple sheets 326, also of length 272. Sheets 326 in both drain 12 and source 200 are connected to input connector 341 and output connector 340 respectively as described above. In this manner, a single set of connectors serve for input and output instead of the multiple connectors 208 and 262 of FIG. 13. This configuration results in greater simplicity and lower manufacturing and production costs. For clarity, source and drain appendage interconnects are shown on opposite sides of stage output 215. For compactness, both the input and output appendage interconnects may be on the same side of output stage 215 (e.g., the source side).

Referring again to FIG. 28, fingers 327 are of substantially uniform impedance. For a sheet 326 of uniform thickness, uniform impedance may be achieved with all fingers 327 having the same widths 328 and lengths 236. Alternatively, for a sheet 326 of uniform thickness, uniform impedance of fingers 327 may be achieved with a constant width 328 to length 236 ratio, that is, as length 236 is shortened, width 328 is narrowed proportionately. In this manner the are described by approximate radius 235 increases in curvature. By progressively shortening the lengths fingers 327, and correspondingly narrowing widths 238 for constant impedance, when progressing from extreme fingers 346 toward center finger 348 the most compact size of twisted fingers 327 (FIGS. 30, 32) may be obtained.

Figure 33:
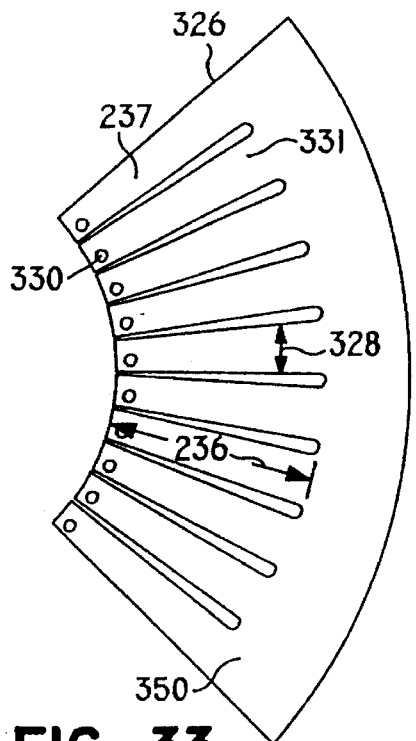
FIG. 33 illustrates a curved insulated slotted sheet conductor.

Referring now to FIG. 33, an alternate embodiment of a curved insulated slit sheet conductor 326 comprise clearance holes 330 disposed generally radially inward as shown from base 350 of specified radius. Fingers 237 may be bent 90 vertically (FIG. 19) resulting in base 350 becoming a flange that may be soldered to drain 12. Multiple curved insulated slit sheets 326 (FIG. 33) may be positioned (FIG. 19) external to and uniformly surrounding the ring of devices 24. Multiple layers (as shown in FIG. 29) of curved slit sheet 326 conductors may be employed. As in FIGS. 30 and 32, fingers 237 are brought into alignment and joined together. Curved slitted sheet conductors may also be mounted on the circular construction of FIG. 20 in the same manner as was done in FIG. 19.

The multiple paralleled and insulated slit sheet conductors 326 provide a transition, or transform, from an extended linear sheet current 189 to a point current at connectors 340. As best seen, for example in FIG. 32 and in cluster 163 of FIG. 13, a point source current 189 at input connector 340A suitably transitions to an extended uniform sheet current on slitted sheet 326, whereupon the current is next fed to drain 12 and thence through devices 24 to source 200, all the while suitably maintaining parallel flow characteristics due to, inter alia, the uniform impedance of the circuit. Source 200 discharges current 189 again to a slitted sheet 326 which smoothly and uniformly transitions current 189 back to a point at output connector 340. This same topology and construction may also be applied to the embodiments of FIGS. 10–12 and 17, 18.

Due to the symmetrical construction of slitted sheets 326, there is no crossing or merging of current 189 in the path from input connector 341 to output connector 340. The current flow 189 is substantially orthogonal, on average, to the line 201 joining the centers of devices 24. The appendage interconnect described in FIGS. 28, 29, 30 may be suitably employed as input or output interconnects on the linear drains and sources in FIGS. 10, 11, 12, 13, 14, 15, 17, 18, 19 and 21.

All points remote from the common connection junction, the input, output, and power appendage interconnects (e.g., the Litz wires or the multiple paralleled slit sheet conductors, etc.) are physically and electrically isolated from the circuit. Thus, in some of the embodiments described herein, the flexible appendage interconnects or Litz wires may assume arbitrary geometries when routed to and from common connection points at power sources and loads. Being electrically isolated, there is only inductive and capacitive coupling between the appendage interconnects and the circuit construct and, thus, substantial electrical symmetry is nonetheless maintained within the circuit despite the arbitrary geometries of remote connectors.

Figure 17:
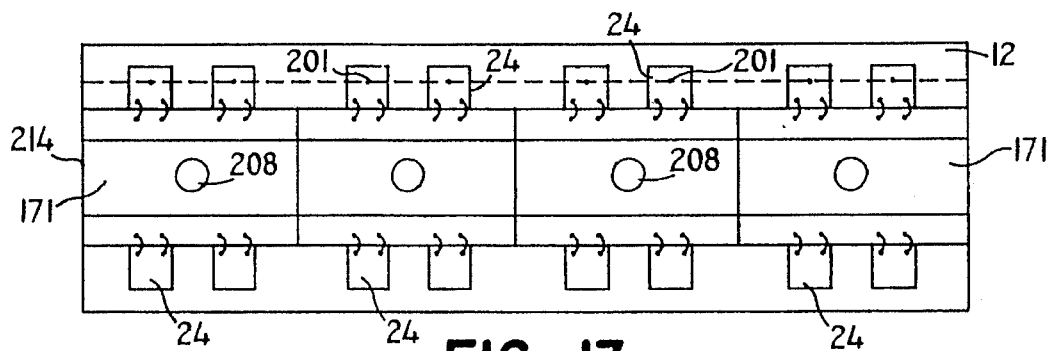
FIG. 17 is a top view of a linear air cooled stage element employing two rows of devices.
Figure 18:
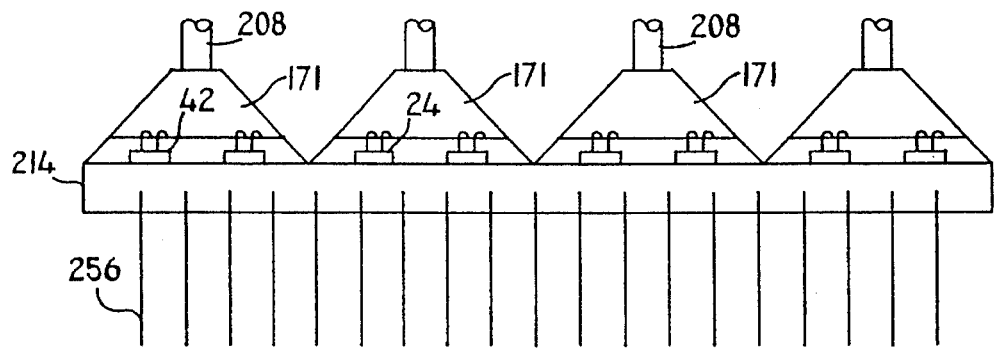
FIG. 18 is a front elevation view of the apparatus in FIG. 17.

Referring now to FIGS. 17 and 18, an alternate embodiment of a linear air cooled element 214 employs two rows of devices 24. As in FIG. 13, the centers of devices 24 lie substantially along line 201. The two rows of devices 24 are positioned on drain 12 for optimum heat transfer relative to fins 256. Source segments 171 are positioned between the two rows of devices 24 and have drive devices 26 layouts similar to that shown in drain segment (i.e., cluster) 161 of FIG. 13. Source segments 171 are now perpendicular (FIG. 18) to drain 12 instead of parallel as in FIGS. 13, 14, 15. This permits symmetrical and uniform source lead bonds 42 to be made on both sides of source elements 171 from the row of devices 24 on each side. Miniature source elements 173 (FIG. 16) may alternatively be employed. As in FIG. 14, the planes of fins 256 are substantially orthogonal to line 201 passing through the center of devices 24. Mounting of fins 256 on the surface of drain 12 opposing devices 24 is similar to that described for FIG. 14. Series and paralleling of the elements of FIGS. 17, 18 is similar to that for FIGS. 13–15. Electrical symmetry is similar to that of FIGS. 13–15.

Figure 19:
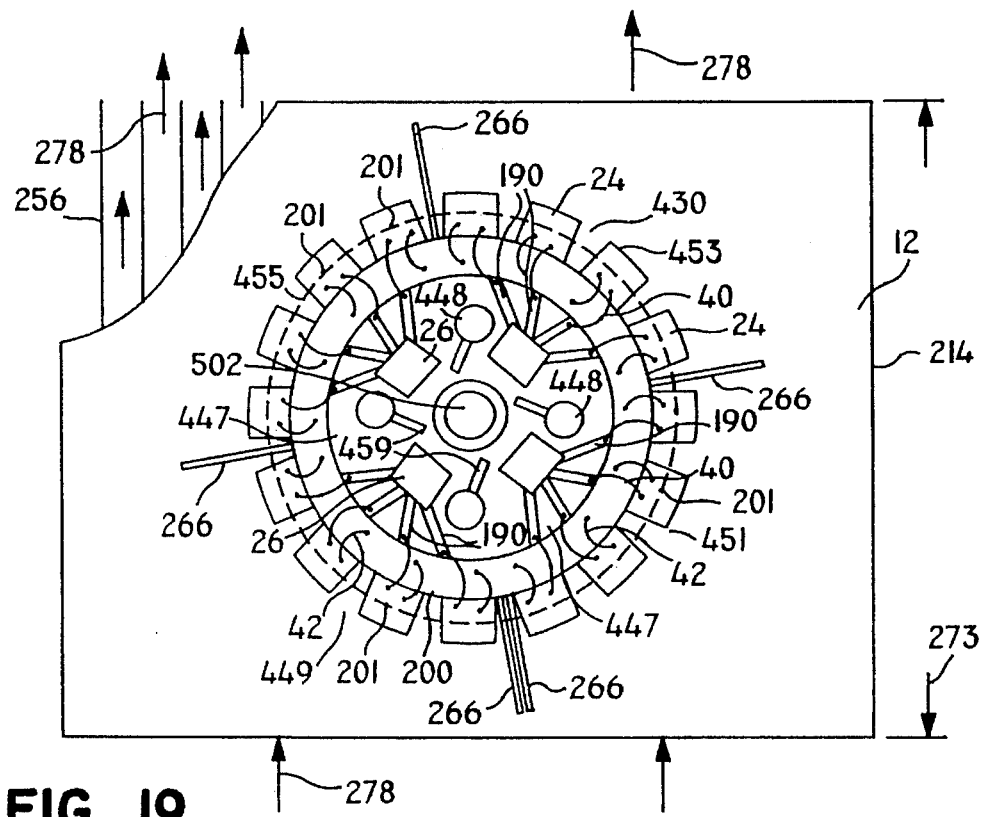
FIG. 19 is a top view of a circular symmetric air cooled stage element with partial cutaways to illustrate driver configuration and air cooled fins.

Referring now to FIG. 19, a top view of an alternate embodiment of an air cooled element 214 comprises devices 24 arranged about a central axis, e.g., in a circle. The line 201 joining the center of devices 24 is thus a polygon approximating a circle. For current flow 189 to be orthogonal to line 201, current flow 189 is illustratively radial (and preferably inward) to maintain smallest dimensions for minimum inductance. Source 280 is also circular and preferably concentric with line 201 which permits source leads 42 of uniform length form all devices 24 to source 280. Source appendage interconnect 208 extends vertically at the center of circular source 280. For electrical design considerations, device groups may be treated as a single element called a device cluster, or sometimes called a cluster. A device cluster comprises a driver device 26, and associated driver circuitry such as the isolated power source 448 of board 447, and the output devices 24 driven by the driver, which typically may range from one to eight output devices 24.

Referring against to FIG. 19, included on board 447 is the driver device 26, gate clamp diodes, isolated gate driver DC power supply and filter capacitors, isolated pulse transformer, and coupling network collectively designated as an isolated power source 448. This circuit board provides a separate source coupling ground sheet which does not carry any of the main power current. Provided is a noninteractive gating mechanism such that the impedances for the main current path are essentially identical. Also, by use of a two sided board a common gate lead is integrated with the separate source lead into a low inductance structure.

Circular symmetric driver board 447 is shown accommodating four isolated power sources 448 to drive four clusters, 449, 451, 453 and 455, each incorporating four devices 24. More or fewer power sources 448 may be accommodated to drive a specified number of clusters with the clusters typically incorporating from one to eight devices 24. Each power source 448, which includes a driver 26 thus drives four devices 24, through electrically symmetrical interconnects 190. Radial slots 266 in drain 12 directed to the central axis 502 serve to partially isolate devices 24 in adjacent dusters 449, 451, 453 and 455. Multiple adjacent slots 266 may be employed to further enhance high frequency isolation of clusters. Fins 256, as seen in the partially cutaway portion of drain 12, are mounted on the surface of drain 12 opposing devices 24 (as described for FIG. 14) and cooled by air flow 278, for example from a fan (not shown) fins 256 extend the width 273 of drain 12, suitably configured as a flat rectangular plate although drain 12 may also be circular. The electrical symmetry of FIG. 19 is dramatic: the radial paths traversed by current 189 from any device 24 across source 280 and up source appendage interconnect 208 is the same as every other device 24, which provides substantially uniform impedance for all devices 24 and consequent electrical symmetry, resulting in uniform current sharing.

Figure 20:
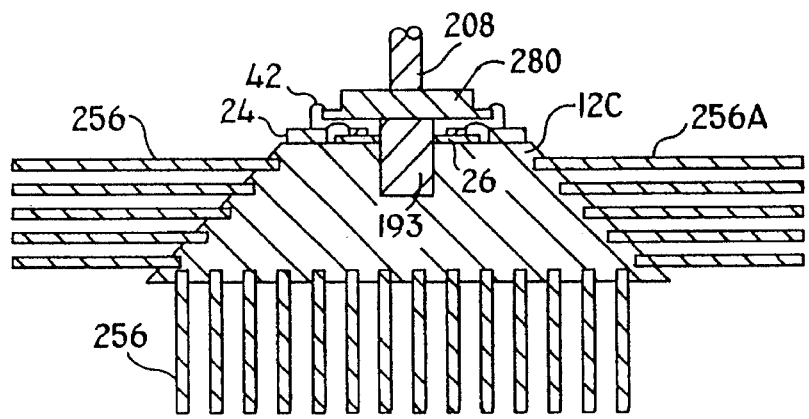
FIG. 20 is a cross section view of a circular symmetric air cooled stage element with added radial fins.

Referring now to FIG. 20, an alternate embodiment of an element is shown in cross section with a circular symmetric drain 12C. A circular source 280 is suitably mounted on an insulator 193 with a source appendage interconnect 208 fastened to source 280. Drain 12C is suitably circular such that all construction, i.e., respective devices 24, source 280 and appendage interconnect 208, may be conveniently concentrically disposed about the surface of drain 12C. To reduce the size and weight of the assembly, as well as to maximize the cooling efficiency therefore, fins 256A, in addition to fins 256, may be radially disposed about the circumferential surface of drain 12C. To reduce weight with high heat transfer rates, "45° heat transfer configuration may be employed, whereby the outer radial wall of drain 12C slopes at a 45° angle.

Figure 21:
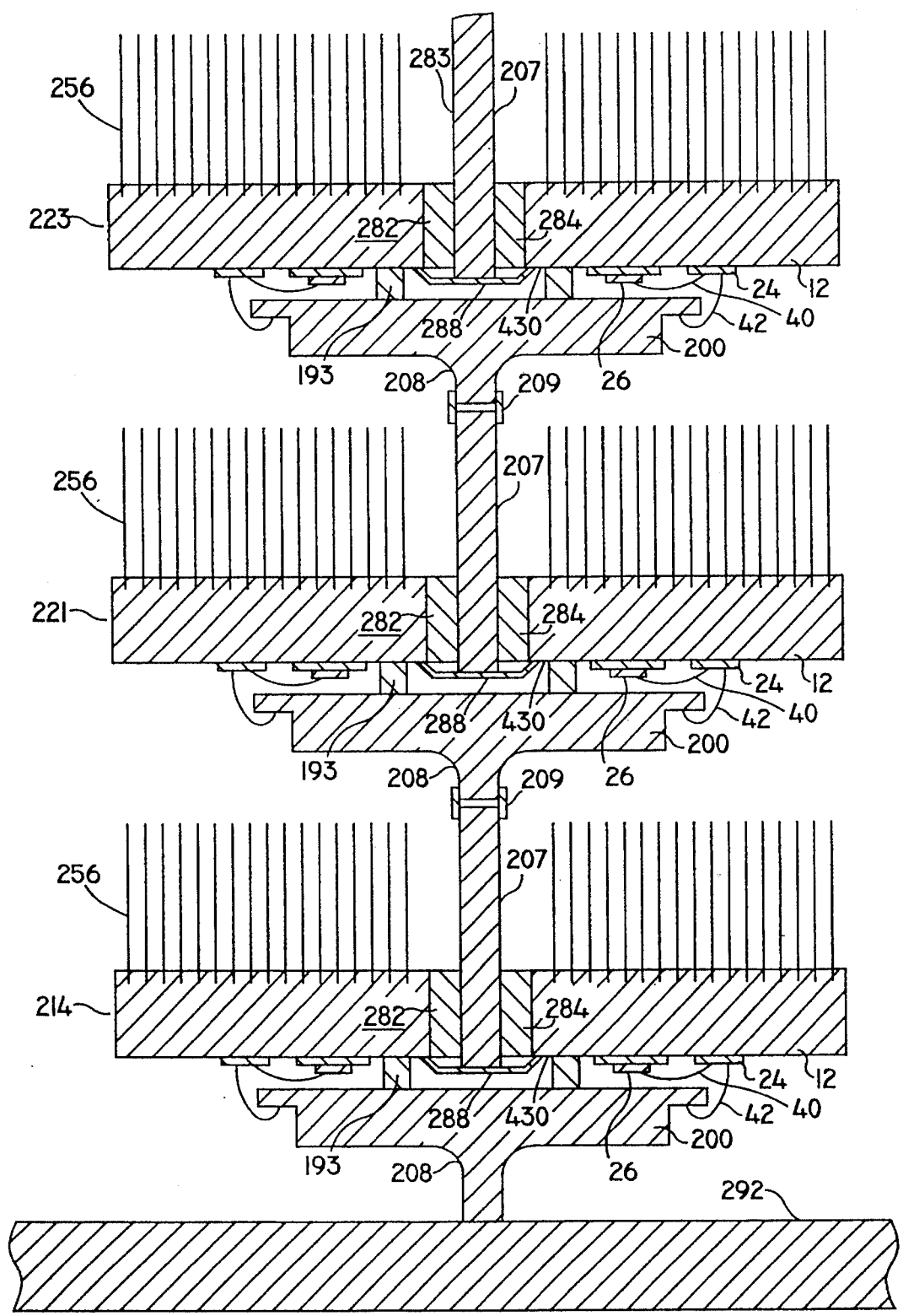
FIG. 21 is a cross section view of an air cooled voltage stage comprising three stage elements, mounted in voltage series connection.

Referring now to FIG. 21, a circuit assembly analogous to that of FIG. 19 in shown in cross section to further illustrate a plurality of stage elements voltage connected in series. For convenience, three exemplary stage elements, 214, 221, 223 are shown, although any convenient number of stage elements (e.g., two to twenty or more) may be stacked in similar fashion.

A central bore (opening) 282 is suitably provided in each drain 12, through which a drain interconnect 207 is substantially coaxially positioned. With the stage elements 214, 221, 223 voltage series stacked, a source appendage interconnect 208 associated with stage element 223 suitably transitions to drain appendage interconnect 207. In like manner, source appendage interconnect 208 of stage 221 is interconnected with drain appendage interconnect 207 of stage 214. A suitable sleeve 209, which may be soldered to respective interconnects 208 and 207, provides electrical and mechanical connection between each respective source interconnect 208 and drain interconnect 207. Thus, stages 214, 221 and 223 are voltage seriesed stacked. In this way, if the devices are rated at, for example 500 V, then the three stage stack is rated at 1500 V. Drain 207 and source 208 appendage interconnects may be of an appropriate nature such as solid bar, tube or Litz wire.

The diameter of opening 282 is suitably larger than the diameter of drain interconnect 208 to provide an appropriate impedance. Insulation 284, e.g., epoxy, suitably fills the space between appendage interconnect 207 and the inside diameter of opening 282. To provide for circular symmetric current distribution from drain appendage interconnect 207 to the surface 430 of drain 12 upon which devices 24 are mounted, a circular symmetric cap 288 (which may be radially slotted) may be employed. More particularly, cap 288 may be soldered to both appendage interconnect 207 and drain 12 at surface 430. If appendage interconnect 207 is Litz wire, the wire end protruding above the surface of drain 12 may be spread radially out in a generally uniform circumferential manner in a 360° pattern and soldered to the chip mounting surface 430 of drain 12 as was cap 288.

Appendage 207 may exhibit any desirable shape in cross section 203, e.g., elliptical, where it passes through the cross section containing cooling fins 256. Appendage 207 may be made elliptical in the region of cooling fins 256, with its longitudinal axis in the direction of air flow for high strength, and the small axis orthogonal to the air flow for minimum pressure drop. Other geometries may also be employed to obtain desired heat transfer, strength, and pressure effects.

Referring now to FIGS. 49 and 50, alternate embodiments of circular, symmetric distribution of devices 24 are shown. The stage element construction of FIGS. 49, 50 is generally similar to that of FIG. 19, and may also be series voltage connected in a manner analogous to that shown in FIG. 21 for the stage element construction of FIG. 19. In general, cooling fins 256 of stage elements 214, 221 and 223 are oriented parallel to each other to receive a common flow of cooling air. The design of the assembly shown in FIG. 21 also exhibits substantial electrical symmetry: the current flow 189 from any of the paralleled devices 24 does not cross or merge, in any substantial manner, with the current flow from any of the other paralleled devices prior to converging at the appendage terminal or external connector where the current convergence or divergence (e.g., at the drain) is controlled and predetermined. All current paths, being substantially identical in construction, accordingly exhibit substantially identical impedances. The electrical symmetry resulting from the above ensures minimum device cross coupling and substantially uniform current sharing for best efficiency and maximum operating frequency.

Figure 22:
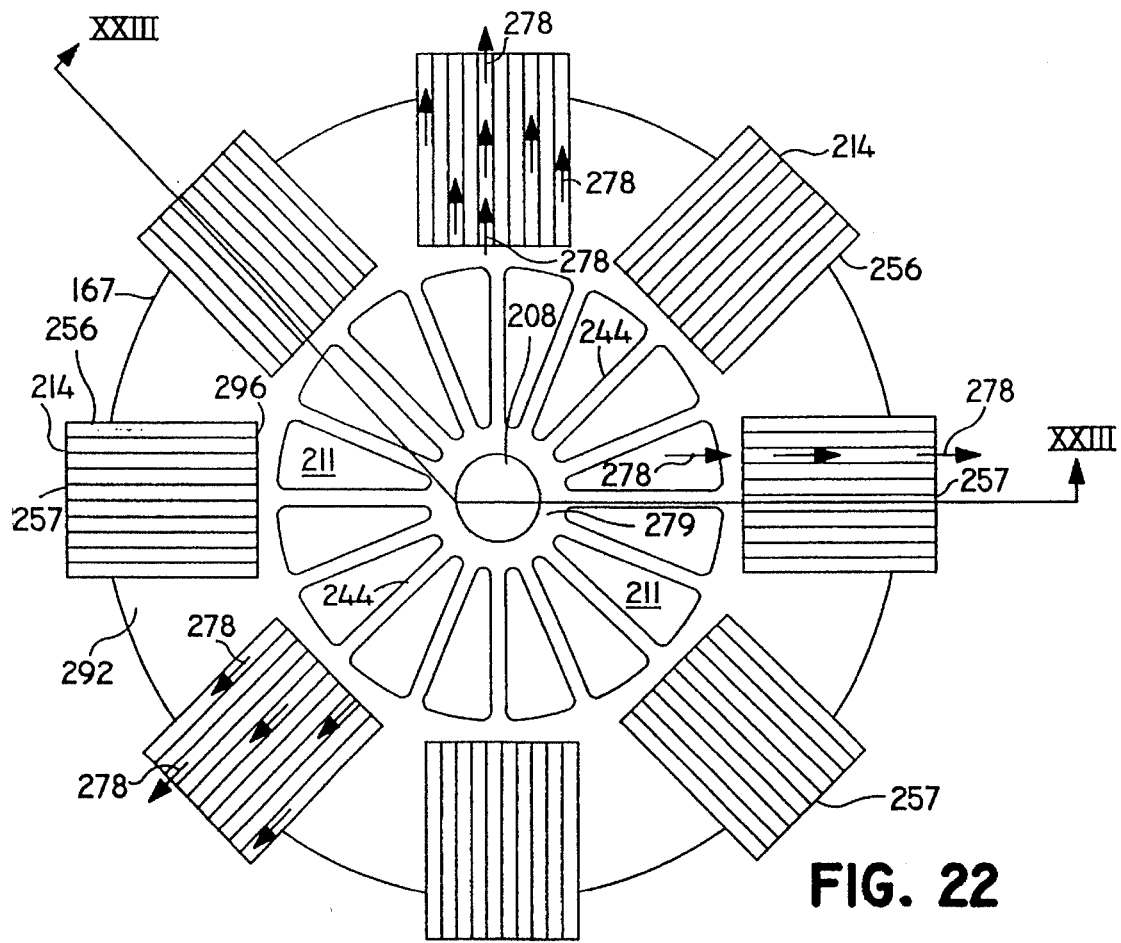
FIG. 22 is a top view of a circular symmetric air cooled power output driver incorporating multiple voltage output stages mounted on radial surfaces.
Figure 23:
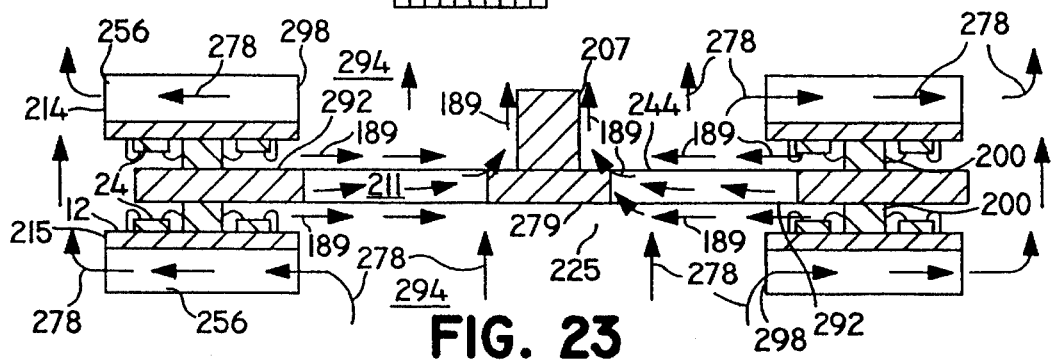
FIG. 23 is a cross section view taken along XXIII—XXIII of FIG. 22.
Figure 24:
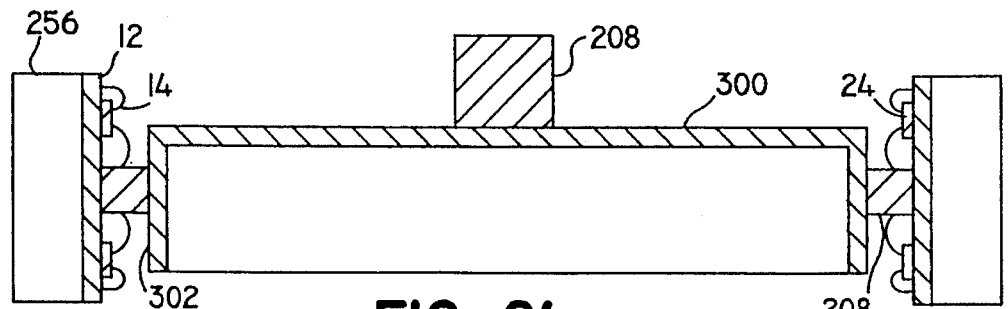
FIG. 24 is a cross section view of a circular symmetric air cooled power output driver incorporating multiple voltage output stages mounted on the peripheral surface.

To provide for the large scale paralleling of voltage stages to obtain currents in the thousand ampere range as is required for large electric motor and Utility use, reference is now made to FIGS. 22, 23, 24.

A basis for paralleling large numbers of voltage stages into one very large output stage employs a large version 167 of the "Wagon Wheel" source interconnect 20 of FIG. 1. Source interconnect 167 may be of a suitable metal such as copper, copper alloys, aluminum etc. Referring now to FIG. 22, source interconnect 20A is provided with respective radial extensions 244 (spokes) that radiate from collective source appendage interconnect 207 to the "wagon wheel" outer radial surface 292. The design criteria for spokes 244 and cutouts 211 between spokes is similar to that used for source interconnect 20 of FIGS. 1 and 2. The characteristics of current flow 189 for source interconnect 20A and output appendage interconnect 207 of FIGS. 22, 23 are substantially identical to those described for source interconnect 20 and source appendage interconnect 208 of FIGS. 1 and 2.

For purposes of illustration, linear air cooled elements 214 (analogous to that shown in FIGS. 17, 18) are mounted on both opposing outer radial surfaces 292. Elements 214 are electrically and mechanically attached to surfaces 292 equidistant from the axis of appendage interconnect 207. The central axis output appendage interconnect 207 is substantially coincident with the central axis of source interconnect 167. Elements 214 are disposed on surfaces 292 with uniform spacing between elements 214. In this manner uniform impedance, from source 200 of elements 214 to source appendage interconnect 207, is maintained for all elements 214. Central fin 257 of elements 214 is oriented radially towards appendage interconnect 207 to receive air flow 278 flowing through source interconnect 167 cutouts 211. It should be noted that the tapered source segments 171 of FIGS. 17, 18 are replaced by a solid rectangular member 200 since tapered sources are not needed, i.e., continuous electrical and mechanical contact between surfaces 292 and source 200 of element 214 over the length 272 of drain 12 is desired. Source 200 is solid and unbroken similar to source 200 in FIG. 12.

Referring now to FIG. 23, cooling air flow 278 is shown traveling up a central conduit 294 whose outer wall is defined by the ring of elements 214 mounted on source interconnect 167. Cutouts 211, which serve to provide an electrical path for current from elements 214 on the surface 292 opposing that of source appendage interconnect 207, also serve to provide a passage for forced flow cooling air. The internal perimeter surface 298 of central conduit 294 defined by elements 214 has it surface blocked off except for cross section presented by fins 256. In this manner, air forced up central conduit 295 is directed only over fins 256. Discharge air 278, after passing over fins 256, may be exhausted directly to ambient, or may be directed up a discharge conduit.

Referring now to FIGS. 17–18, elements 214 of FIGS. 17, 18 may be replaced by linear air cooled element 214 of FIG. 13 for another preferred embodiment. Here again multiple tapered source elements 171, 173 are replaced with a single rectangular source 200 similar to that in FIG. 12 to provide continuous electrical and mechanical contact the length of drain 12. Fin 256 orientation is radial as shown in FIG. 22. Operation and current flow characteristic are substantially as those described for element 214 of FIGS. 17, 18.

With continued reference to FIGS. 17–18, a further embodiment of the invention is to now replace elements 214 of FIGS. 17, 18 with elements 214 of FIG. 19. Source appendage interconnect 208 is mounted on both opposing surfaces 292 of source interconnect 20A with fins 256 radially oriented as previously described. Operation is similar to that described for element 214 of FIGS. 17, 18.

Yet another embodiment of the invention invokes replacing element 214 of FIGS. 17, 18 with the three element air cooled voltage output stage of FIG. 21 on surfaces 292 of source interconnect 20A. In this embodiment an arbitrary number of elements, e.g., 214, 221, 223 may be connected in series to obtain a desired high output voltage. Thus, both high currents and high voltages may be obtained. Air cooled elements 214, 221, 223 employed may be of linear construction or as per FIGS. 13 and 17, or circular as per FIG. 19.

For still higher current output, the liquid cooled constructs of FIGS. 2, 3, 10 and 11 may replace air cooled element 214 of FIG. 17 on source interconnect 167 surfaces 292. In FIG. 2, elements 214, 216 of stage 215 may be paralleled or operated as an AC output as described. All stages 215 of FIG. 2 mounted on source interconnect 167 would be operated in one of the above modes. With liquid cooling, no air flow is required. For ease of connections, coolant connectors 56, 58 face radially outward (FIGS. 2,3). Source appendage interconnect 208 of FIG. 2 is connected to both opposing surfaces 292 of source interconnect 167. Liquid cooled stage 215 of FIG. 3 may also replace element .214 of FIG. 17. Here elements 214, 221, 223 and 216, 227, 229 are seriesed for high voltage output. Again the voltage output stages may be paralleled or operated in the AC mode. In like manner, the liquid cooled voltage stages 215 of FIGS. 10 and 11 may be employed by replacing element 214 of FIG. 17 on source interconnect 20A surfaces 292.

In all the foregoing embodiments where the elements and stages of FIGS. 2, 3, 10, 11, 13, 19 and 21 replace those of FIG. 17, substantially uniform radial displacements from the central axis and uniform circumferential spacing is maintained. This ensures substantially uniform impedances between the source to surface 292 interconnect and source appendage interconnect 207 for all elements or stages mounted on source interconnect 167.

A further configuration for paralleling multiple elements or stages is shown in FIG. 24 where a circular symmetric ring 300 comprises a cylindrical surface 302. To the periphery of external cylindrical surface 302 are mounted multiple air cooled elements of FIG. 19 girdling the circumference of surface 302 and uniformly spaced from each other. Operation is similar to that described for FIGS. 22, 23. In the place of element 14 of FIG. 19, any of the other elements or stages described for use in FIGS. 22, 23 may be employed in FIG. 24. The design of FIGS. 22, 23 and the various constructs of FIGS. 2, 3, 10, 19 and 21 alternatively employed in FIGS. 22, 23 meets the criteria for electrical symmetry outlined herein.

Referring now to FIG. 25, three single phase AC air cooled modules 310, 312, 314, may be combined to provide three phase power. To provide the proper phase relationship, the output voltage and current from each module is 120° out phase with the other two. The major elements of each module are fan 304, outer shroud 306, inner shroud 308 and output stage 215 composed of element 214, 216. Each module 310, 312, 14 may also incorporate other power conditioning components such as capacitors, transformers etc. A suitable output stage 215 for use in modules 310, 312, 314 composed of air cooled linear elements 214, 216 is shown in FIGS. 13–15, or alternatively the air cooled circular construct of FIG. 19 may be adapted. External shroud 306 serves to confine within fin structure 256 the air flow 278 from fan 304. Shroud 306, made of a dielectric, e.g., plastic, also serves as electrical insulation for fins 256 which are at elevated electrical potential. Elements 214, 216 within modules 310, 312, 314 may be voltage seriesed, current paralleled or operated in the AC mode as described for FIGS. 13–15. Shroud 308 blocks air flow over devices 24 and source 171 (FIG. 13–15) instead diverting air flow 278 to fins 256 of elements 214, 216. Small apertures may be made in shroud 308 to permit a predetermined cooling air flow 278 over source elements 171 etc. A compact, unitized three phase power module 310–314 has been described that is easy to replace and repair.

Referring now to FIG. 26, a three phase power arrangement for very high power requirements, e.g., the thousand ampere range, comprises three assembled output stages, 316, 318, 320 as described in FIGS. 22, 23. Each assembled output stage 225 is composed of source appendage interconnect 207 and source interconnect 167 incorporating multiple output voltage stages 167. Voltage stages 215 are connected in parallel on source interconnect 20A. Output stages 215 may comprise the liquid cooled seriesed elements 214, 221, 223 and 216, 227, 229 of FIG. 3 for high voltage output. Each voltage stage 215 is operated with elements 214, 221, 223, 216, 227, 229 tied in parallel. Half the voltage stages 215 are biased positive and the other half are biased negative thus providing one of the three phases. The other two assembled output stages 316, 318 are constructed in the same manner as 314. Each of the output stages 314, 316, 318 is operated 120° out of phase with each other to provide proper three phase output. Output stage 225 may also employ the elements or voltage stages of FIGS. 2, 10 and 11 for liquid cooled systems, or the air cooled elements or voltage stages of FIGS. 13, 14, 18 and 19.

Referring now to FIG. 27, a three phase power arrangement comprises three output stages 320, 322, 324, each output stage being composed of two voltage stages 215, 217 of FIG. 3 joined at appendage interconnects 208. Stage elements 214, 221, 223, 216, 227, 229 (FIG. 3) of output stage 320 are tied together for parallel operation on of each voltage stages 215, 217 with one stage biased positive and the other biased negative. Appropriate driver output signals drives chips 24 on positive and negative drains 12 and 14 with proper signals to provide an AC output. Output stages 322, 324 are constructed and operated in the same manner as is output stage 320 except that the output phase angle is 120° apart for each stage for proper three phase operation. For high frequency application, one output stage, e.g., 320, may be enclosed in a resonant cavity and employed in an induction heating apparatus.

Figure 34:
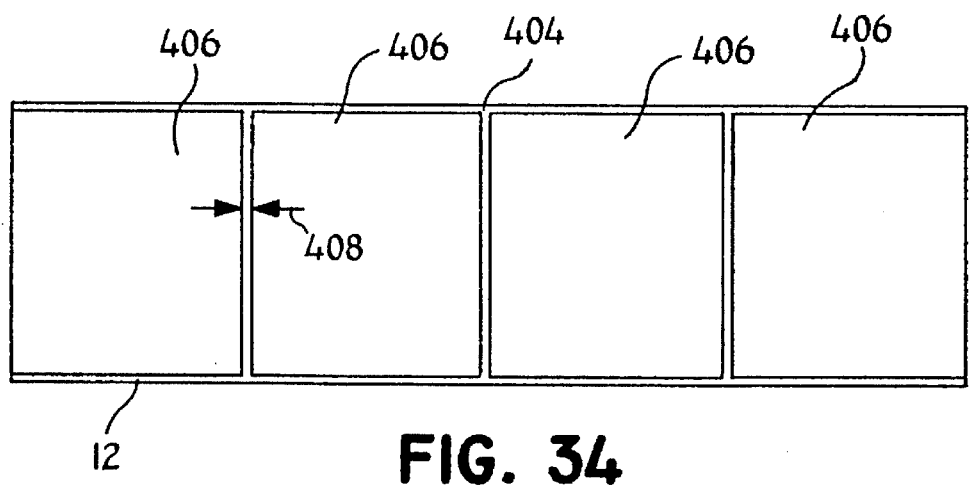
FIG. 34 is a face on view of the drain heat exchange surface with ceramic insulating tiles attached.

Referring now to FIG. 34, a further alternative embodiment of the present invention surrounds a heat sinking method in which electrical insulating material having good thermal conductivity is adhered to the heat exchange surface 404 of exemplary drain 12. A good candidate material is alumina ceramic ($Al_2O_3$) which has moderately good thermal conductivity and excellent electrical insulating properties, i.e., in the range of 200 V/mil. Alternatively, high thermal conductivity plastics, e.g., epoxies, loaded with, for example $Al_2O_3$, AlN, BeO etc. may be employed.

Referring again to FIG. 34, heat exchange surface 404 of drain 12 has multiple thin tiles of high thermal conductivity insulator 406 such as alumina ceramic ($Al_2O_3$) which has, for example, been metalized on both surfaces for soldering to surface 404 of drain 12. Other ceramics including Beryllia, ALN etc. may be used. The opposing surface of insulator 406 may be soldered or otherwise attached to a heat sink such as an electronic chassis. Alternatively, one surface of the ceramic may be metalized and soldered to surface 404 of drain 12 and a suitable material, such as thermal grease, may be used on the opposing surface to interface with the heat sink (e.g., the chassis). Multiple ceramic tiles 406 are suitably employed to minimize the stresses of differential expansion upon heating and cooling which a large single piece of ceramic often cannot tolerate without cracking. Small spacing indicated in FIG. 34 by the reference character 408, e.g., 0.2 mm, between tiles is sufficient. The thickness of respective tiles 406 may range from 0.1 mm to 3 mm with mechanical strength being a significant design factor. The dielectric strength of such tiles is more than adequate for virtually any thickness used. Typical thicknesses will range from 0.3 to 1 mm.

Figure 35:
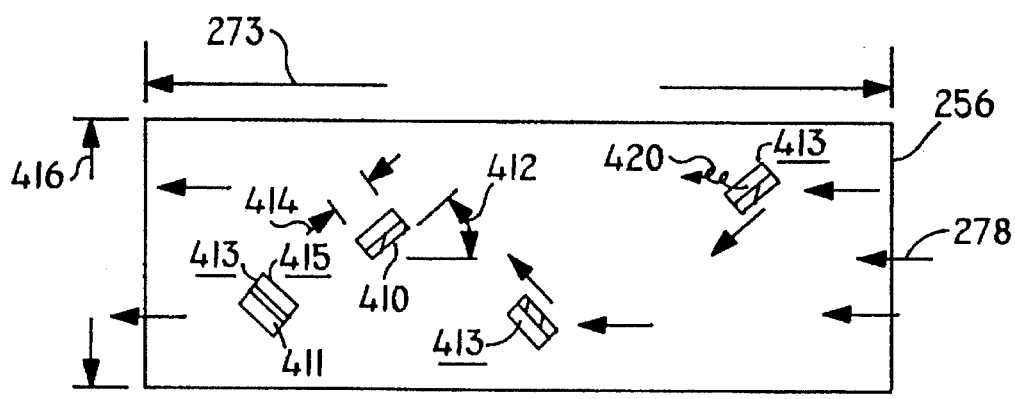
FIG. 35 is a side view of a heat exchange fin with bent out tabs to divert the air flow.
Figure 36:
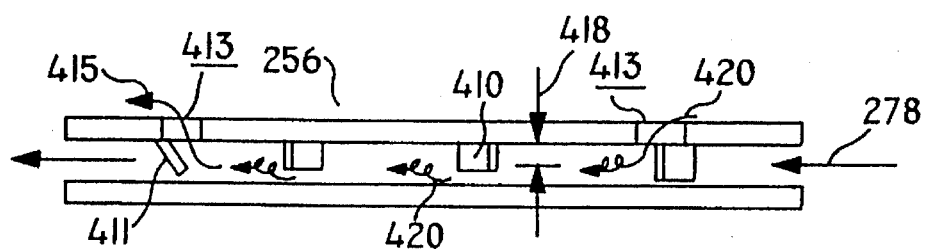
FIG. 36 is a top down view of two cooling fins with bent out tabs to divert the air flow.

Referring now to FIGS. 35 and 36, in the flow of cooling air over fins 256 in the various air cooled embodiments described herein, the thermal efficiency generally decreases as the length 273 of fin 256 increases in the direction 278 of air flow to a resulting thermal boundary. By breaking up the thermal boundary, cooling efficiency may be reestablished and/or enhanced.

Figure 44:
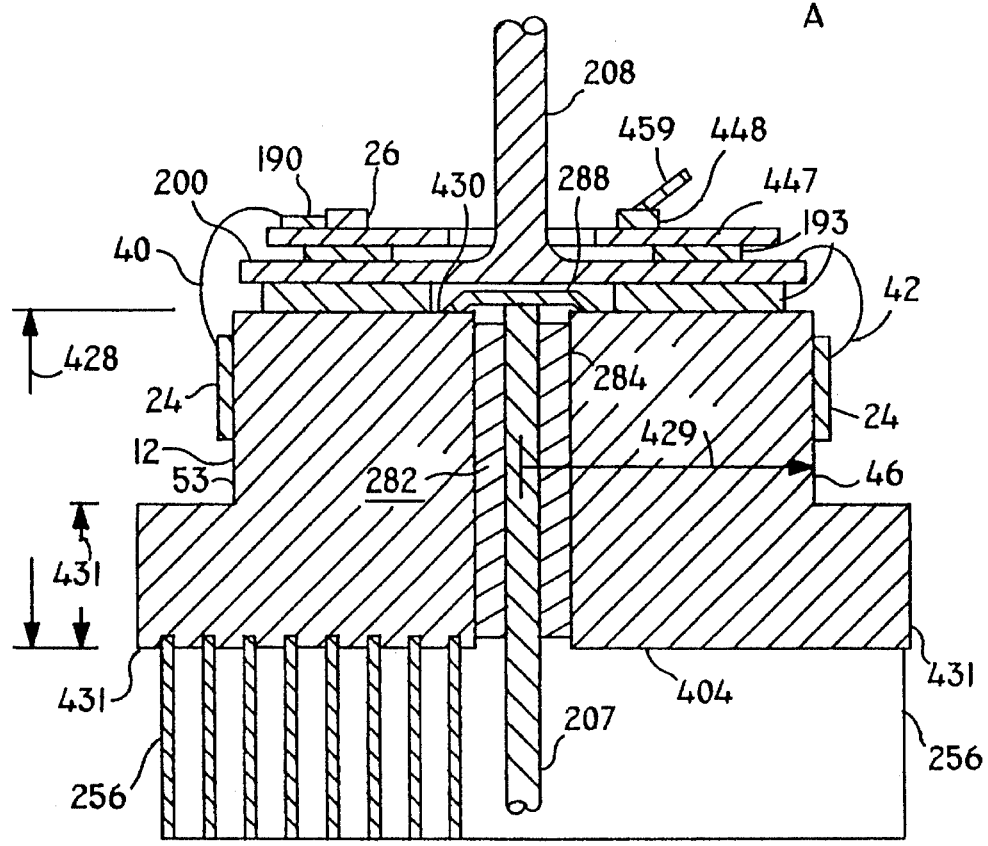
FIG. 44 is a cross section view of FIG. 43 through section A—A.

Referring now to FIG. 35 which is a side view of a typical fin 256, a plurality of tabs 410 are suitably punched and bent out at an angle 412 with respect to the surface of one or more of fins 256. Angle 412 may be + or −5 to 85°; a positive angle 412 directs the coolant (air) upwards towards the tips of fins 256, whereas a negative angle 412 tends to direct the coolant downward toward drain 12 heat exchange surface 404 (FIG. 44). Any number of arbitrary angles 412 may be employed. Tab 410 dimensions 414 are small compared to the fin height 416. Thus, there is no substantial obstruction to air flow. Also, since the air flow is simply angled by tab 410, i.e., a small jet, the pressure drop is small. With a suitable geometry and number of tabs 410 in appropriate locations along fins 256, the thermal boundary may be disrupted and efficient heat transfer can be maintained.

Referring now to FIG. 36 which shows a pair of adjacent fins, tabs 410 are shown protruding out various distances 418 into the space between fins, which with proper design can create vortices 420. On the backside of tabs 410, low pressure regions are created which can suck air through aperture 413 from the adjoining channel thereby creating further vortices 420 to help break up the thermal boundary.

Referring again to FIG. 36, a further geometry of tab construction is shown with tab 411 which is shown bent out at less than 90 from fin 256 and the aperture 413 in the fin 256 wall created by bending out tab 411 is upstream of tab 411. Tab 411 construction "scoops" the air flow 415 and causes it to smoothly flow into the adjacent air conduit through aperture 413. This also provides turbulence to break up the thermal boundary and improve heat removal. Tabs 411 may be curved for smoother air flow. Tabs 410, 411 may be of suitable geometry for ease of manufacture such as rectangular, curved, e.g., semi-circular, etc. With the foregoing construction, high thermal efficiency may be obtained from fins 256 over substantially the entire length 273 in the direction of air flow 278.

Figure 37:
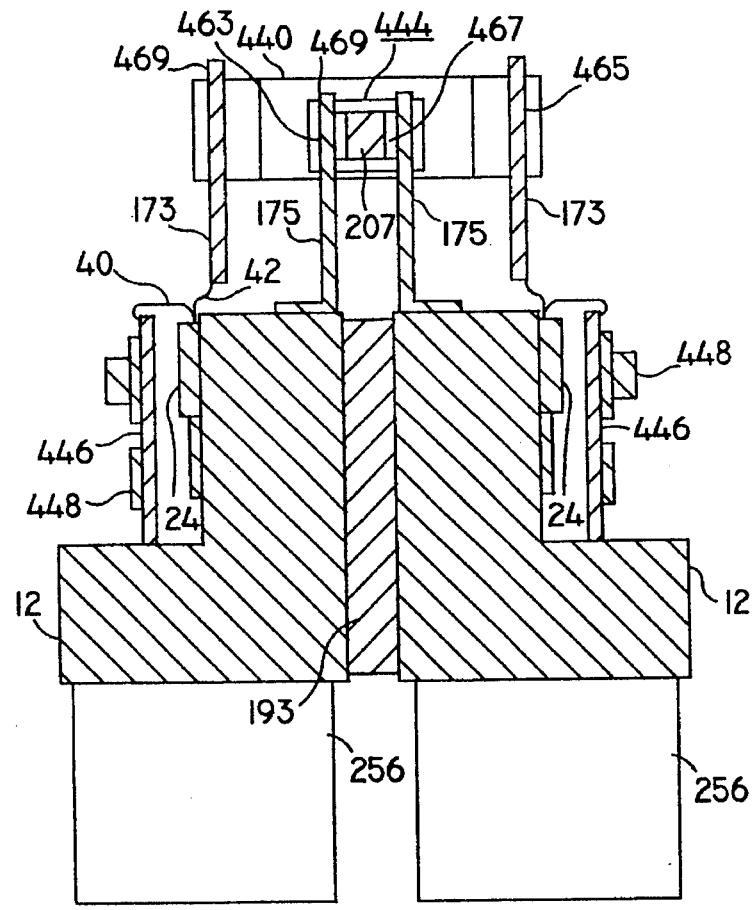
FIG. 37 is a cross section view of an air cooled converter employing two "L" shaped electrode and attached driver boards.
Figure 38:
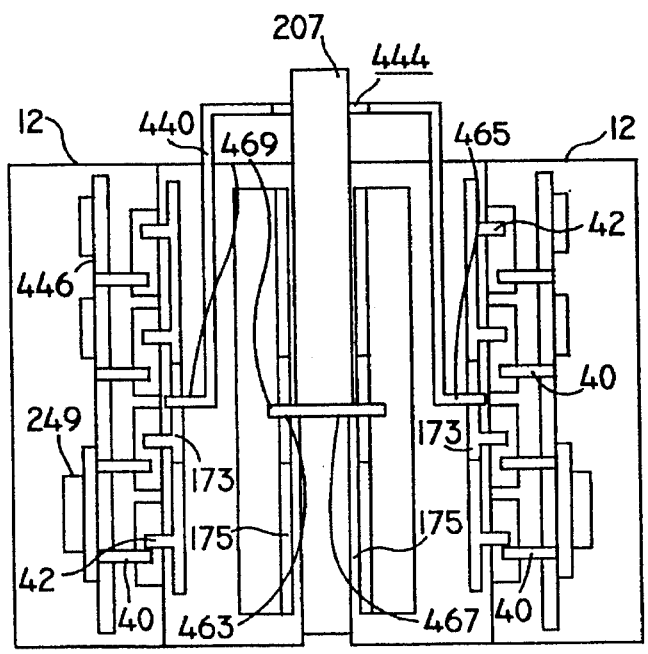
FIG. 38 is a partial sectional top down view of the converter of FIG. 43.
Figure 39:
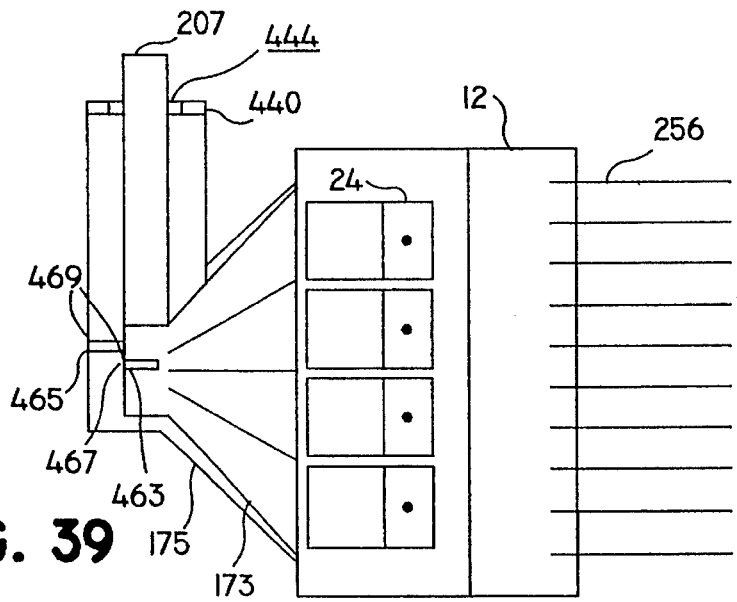
FIG. 39 is a side view of FIG. 38 with removal of selected elements for illustration purposes.

Referring now to FIGS. 37–39, shown is a further preferred embodiment of the circuit assembly of the present invention. Drain 12 is shown in cross section as being generally "L" shaped. As best seen in FIGS. 37 and 38, two "L" drains 12 may be mounted back to back and separated by electrical insulator 193. Devices 24, four each in this example, are mounted on faces of each drain 12 opposing insulation 193 as shown in FIGS. 37–39. Tapered source segment 173 and drain segment 175 (analogous to those described in FIGS. 13 and 16) are mounted as shown in FIGS. 37–39. Tapered drain segment 175 is mounted close to the wall of drain 12, for example abutting insulator 193, and tapered source segment 173 is suitably disposed in close proximity to the face of drain 12 having devices 24 mounted thereon in order to minimize the lengths of respective leads 42 to reduce inductance. At the apex 469 of both tapered drain segments 175, slots 463 are suitably disposed at the midpoint of apex 469. Similar slots 465 may be prepared in the apex 469 of source segments 173. A sheet cross piece 467 is suitably attached to and centered with drain appendage interconnect 207, and conveniently fits into drain slots 463 and is fastened, e.g., soldered, into place to provide an electrically symmetric connection. In a similar manner, source appendage interconnect 440, which may be a sheet of metal having an aperture 444 for interconnect 207 to protrude there through, may be formed as shown with each end fitting into slots 465 and fastened in place, e.g., soldered. Each drain 12 is suitably configured as a single cluster.

In accordance with one aspect of the present invention, the foregoing electrically symmetric construction permits inductors, etc. to be connected while maintaining substantially uniform and minimal impedance characteristics. The foregoing illustrates electrically symmetric parallel electrical connection of source 173 and drain 175 interconnects from the two drains 12 to thereby increase current output. To provide for electrical series connection of the two "L" shaped drains 12, interconnection similar to that shown in FIG. 15 may be employed.

Again referring to FIGS. 37 and 38, a rectangular driver board 446 is provided for each "L" shaped drain 12 to drive devices 24 mounted thereon. Included on board 446 is the driver device 26, gate clamp diodes, isolated gate driver DC power supply and filter capacitors, isolated pulse transformer, and coupling network collectively designated as an isolated power source 448. This circuit board provides a separate source coupling ground sheet which desirably does not carry any of the main power current. Also provided is a non interactive gating mechanism such that the impedances for the main current path are essentially identical. By use of a two sided board, a common gate lead may be integrated with the separate source lead into a low inductance structure. In this context, a duster comprises the driver board 446 and four devices 24.

Figure 40:
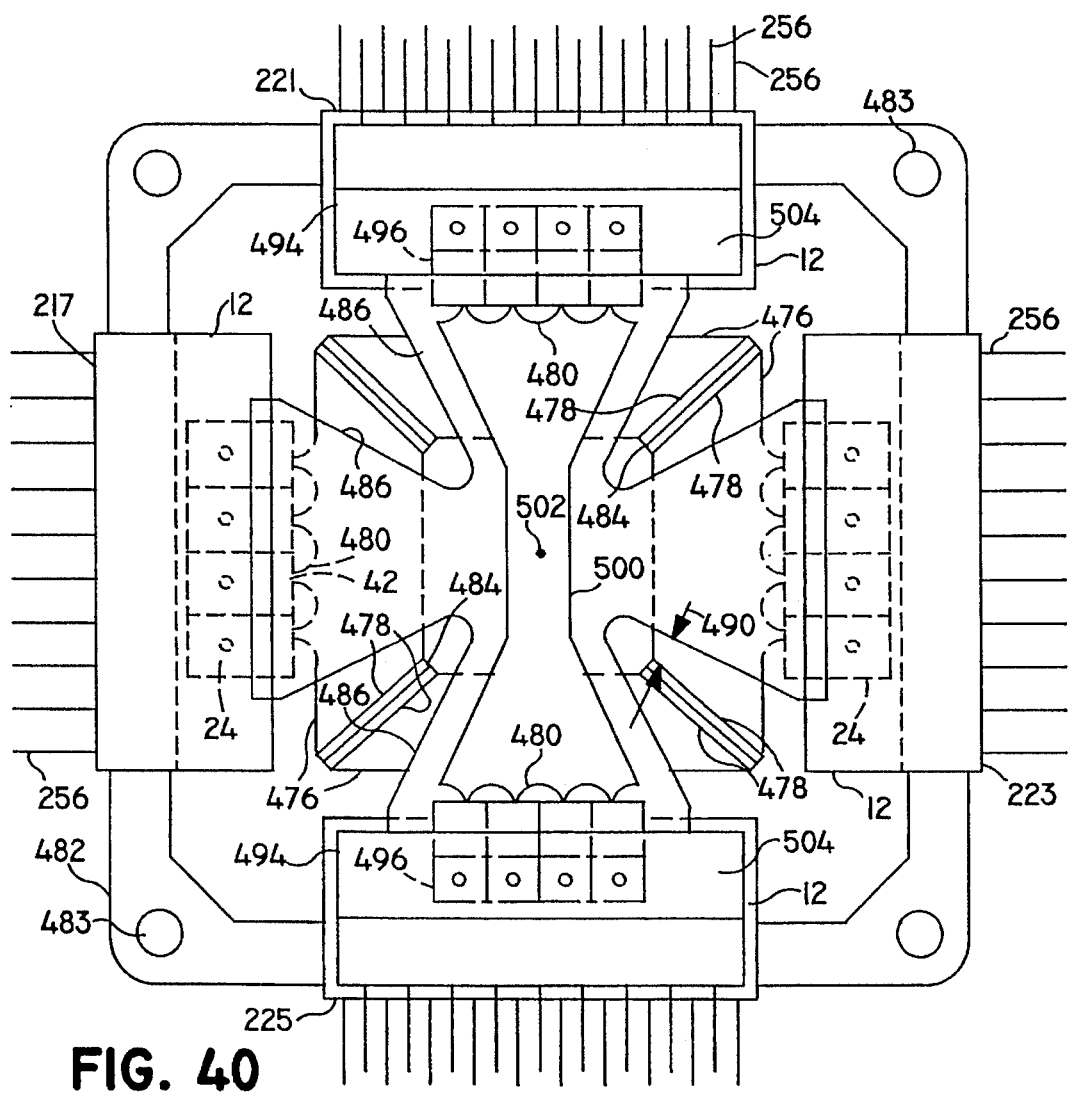
FIG. 40 is a top down view of four linear air cooled paralleled stage elements each of which is a complete device cluster including separate power source.
Figure 41:
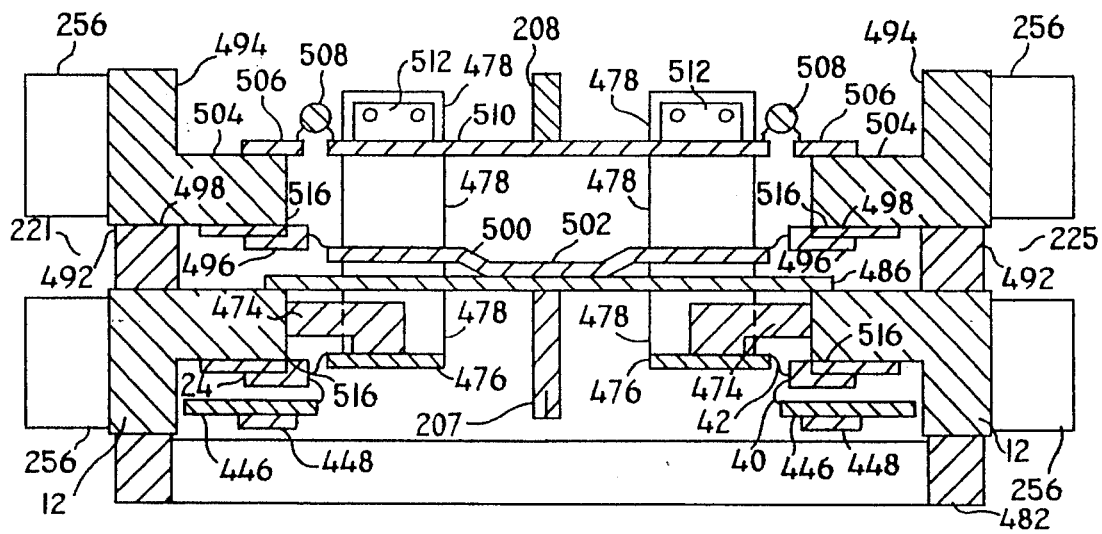
FIG. 41 is a cross section view of FIG. 46 through the two stage elements incorporating catch diode.
Figure 42:
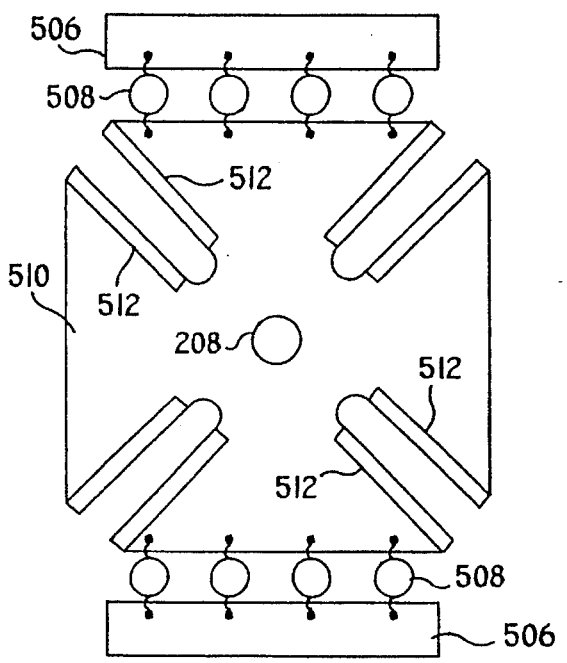
FIG. 42 is a top down view of the source output sheet incorporating RF bypass capacitors.

Referring now to FIGS. 40–42, shown is a further preferred embodiment for the paralleling of linear air cooled stage elements such a those of FIGS. 13–15, 37–39. For illustration purposes, the "L" shaped drains 12 of FIGS. 37–39 will be employed. FIG. 40 shows a top down view of four paralleled stage elements 217, 221, 223 and 225. For clarity purposes, dotted phantom outlines of hidden parts, e.g., devices 24, are employed to illustrate construction, and in general, only one layer deep of phantom outlines are used in order to avoid confusion. Also, to best illustrate and describe construction, certain overlying structures are partially removed. Except for catch diode and catch diode interconnect construction, stage elements 217, 221, 223 and 225 are substantially identical FIG. 41 is a cross section of FIG. 40 through stage elements 221, and 225 and catch diodes 508 and catch diode interconnect 500.

With continued reference to FIGS. 40 and 41, stage elements 217, 221, 223 and 225 each comprise a cluster and each have one "L" shaped drain 12 with four devices 24 and associated power source 448 mounted on board 446 as shown in FIG. 37–39. Insulators 474 are mounted on drains 12 of elements 217, 221, 223 and 225 to which sources 476 are attached. Sources 476 suitably include "wings" 478 bent up 90° at each end. Source leads 42 incorporate curved segments 480 in source 476 to provide a good impedance match to devices 24.

Stage elements 217, 221, 223 and 225 are now mounted by screws, adhesive etc. on insulating frame 482 which may be of rectangular shape. Frame 482, which may be made of a suitable insulator such as epoxy or ceramic, serves to provide accurate mechanical mounting and alignment of elements 217, 221, 223 and 225 and electrical isolation between drains 12. Threaded metallic inserts 483 may be provided in the corners of frame 482 for mounting. Elements 217, 221, 223 and 225 are positioned such that mating surfaces 484 of "wings" 478 of sources 476 are substantially flush with each other, and then fastened together by means such as solder, nuts and screws etc. The next step is to mount drain 486 interconnect, which may be a single piece in the general shape of a Maltese Cross, to commonly interconnect drains 12 in elements 217, 221, 223 and 225. Adequate spacing 490 between wings 478 of source 476 and drain interconnect 486 is provided for voltage stand-off.

Referring again to FIG. 41, insulating spacer 492 is mounted on drains 12 of stage elements 221 and 225 by means such as screws or adhesives. Electrodes 494 also in the shape of "L"s are then mounted on insulators 492. Catch diodes 496 are mounted on surface 498 of electrodes 494. Electrodes 494 and associated fins 256 may be of substantially the same dimensions as drains 12 and fins 256. "Bow Tie" diode interconnect 500 provides an electrically symmetric path from catch diodes 496 to the center axis 502 where diode interconnect 500 joins drain interconnect 486. Construction of electrodes 494, catch diodes 496 and diode interconnect 500 is also shown in FIG. 40. For clarity, subsequent superimposed construction will be restricted to FIG. 41 and 42 to avoid confusion in FIG. 40.

Referring again to FIG. 41, surface 504 of electrodes 494 opposing surface 498 have conductive strips 506 mounted thereon which are parallel to the edge of electrodes 494 and extend substantially the length of the catch diode 496 array.

Connected to strips 506 are one leg of RF bypass capacitors 508. To the other leg of capacitors 508 is source output sheet 510 which extends to stage elements, 217, 221, 223 and 225. Source output sheet 510 has bent up "wings" 512 corresponding to "wings" 478 of source 476 such that mating surfaces may be screwed or soldered together. Source output post 208 is positioned on the center axis 502 of source output sheet 510.

Referring now to FIG. 42, shown is an assembled top down view of source output sheet 510, capacitors 508, strips 506 and output post 514. The construction of FIG. 42 would drop down on FIG. 40 with strips 506 mounting on electrodes 494 of stage elements 221 and 225. Cross section view of FIG. 41 illustrates this construction. Strips 506 may be screwed or soldered in place on faces 504 of electrodes 494 as shown in FIG. 41.

Electrical symmetry is demonstrated in the embodiments of FIGS. 40–42. Referring again to FIG. 40, though the current path from outer devices 24 on source 476 to "wings" 478 is shorter than for inner devices 24, as seen in stage elements 217 and 223, the current path for the inner devices 24 to source output post 514 on source output sheet 510 (FIGS. 41 and 42) is correspondingly shorter. Thus, the impedance seen by all devices 24 to centered output post 208 is substantially equal thereby providing electrical symmetry and uniform current sharing. Shown in FIGS. 40–42 are four paralleled stage elements. Two of these paralleled assemblies may be voltage seriesed in a manner similar to FIG. 21 for high voltage operation in a manner similar to that of FIG. 15.

Figure 43:
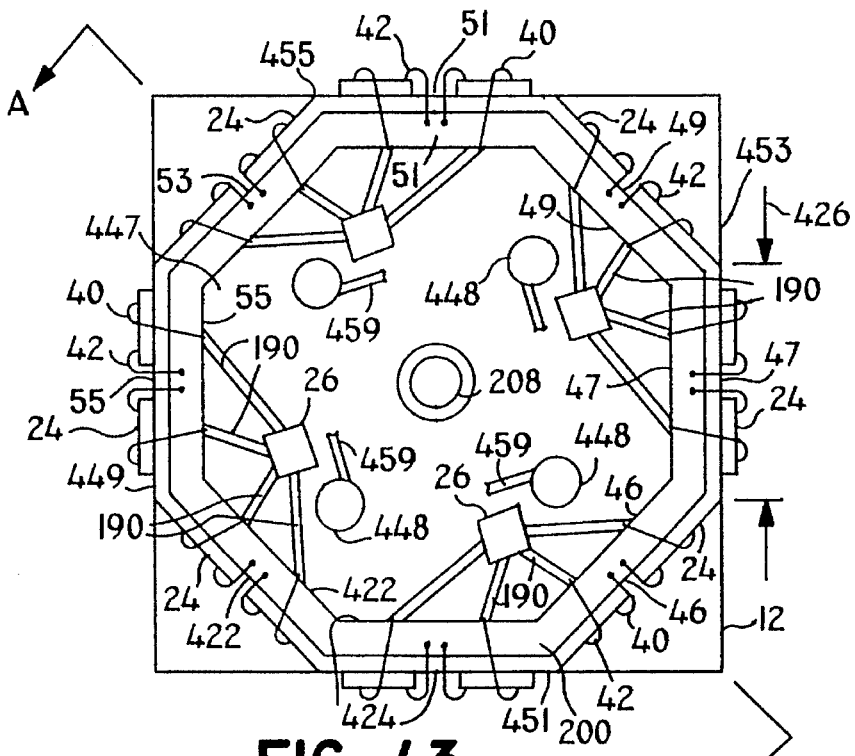
FIG. 43 is a top down view of a power converter with circular symmetric peripheral mounting of devices.

Referring now to FIGS. 43 and 44, shown is circular symmetric converter construction with peripheral mounting of devices 24 in contrast to the planar mounting of devices 24 of FIG. 19. The drain 12 is provided with multiple peripheral flats, 46, 47, 49, 51, 53, 55, 422, 424 upon which are thermally and electrically and mechanically mounted devices 24 (here shown as two devices per flat), though more than two or only one may be conveniently employed. Drain 12 is here shown as being made from square cross section metal such as copper or aluminum. The corners have been partially milled away to provide eight flats 46, 47, 39, 51, 53, 55, 422, 424 of substantially uniform width 426. For adequate heat spreading to cooling fins 256, the height of 428 of electrode 12 is preferably equal to the radius 429, i.e., from the center to any flat. Height 431 of the corners of electrode 12 is maximized to provide improved heat spreading to fins 256 extending to corners 431 of drain 12. Source 200 here, of generally octagonal shape with output post 208 attached, is mounted to and insulated from drain 12 by insulator 193. The generally circular or octagonal shape of electrode 200 minimizes inductance to electrode 12.

Drain 12 is provided with centered hole 282. Drain appendage interconnect 207 is centered in hole 82 and fixed in place by insulating material 284, e.g., epoxy. Appendage interconnect 207 is attached to circular symmetric interconnect 288, which may have multiple radial slots to provide a current path to devices 24. Interconnect 288 is then circumferentially connected, e.g., soldered at its periphery to surface 430 of drain 12 so as to insure circumferentially uniform current distribution. This construction is substantially identical to that employed in FIG. 21.

Slots 266 (not shown) may be provided on the peripheral surface of drain 12 to enhance the high frequency isolation of clusters 449, 451, 453 and 455. Slots 266 (not shown) may extend to the top planar surface of drain 12 and extend radially inward toward the central axis in a manner similar to FIG. 19.

Figure 47:
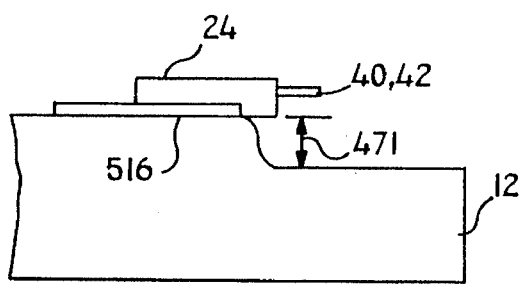
FIG. 47 is a cross section view of a packaged die with spacing provided on the drain beneath the output leads for voltage isolation.
Figure 48:
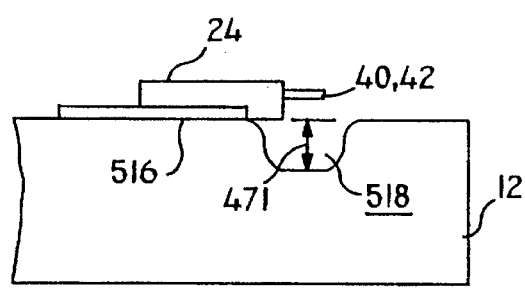
FIG. 48 is FIG. 46 with voltage isolation spacing provided by a channel in the drain.

Referring now to FIG. 47, shown is packaged devices 24 mounted on drain 12. To provide voltage isolation for source 42 and gate 40 leads from drain 12, trough 518 of suitable depth 471 and width is provided. Alternatively, FIG. 48 illustrates a step of height 471 to provide voltage isolation. In all cases inside and outside corners of troughs and steps are preferable radiused to insure smooth current flow. Package baseplate 516, upon which the die is mounted and which serves as the die heatsink, extends to the edge of the trough or step to maximize heat flow. For the "L" shaped drains of FIGS. 37–39, package baseplate 516 would extend to the edge of drain 12 as illustrated in FIG. 39.

The electrically symmetric construction and resulting impedance of device cluster construction assures uniform current sharing if the drive function, i.e., the voltage-current into each of the control elements of the output power devices is substantially identical. An embodiment of this design principle comprises an isolated driver including an isolated power source and drive signal. Employing the same electrical symmetry principles used for the high current paths of the device cluster, the output of the driver is directed to the output power device control terminals which for a MOSFET are the source and gate terminals. With MOSFETs as an example, a secondary common source lead and common gate lead would be attached directly to each output power device. The output from the driver chips would then drive between these two common points thereby providing substantially uniform voltage-current characteristics to each of the output devices, and where the drive signal and high output current share a common path, the impedance seen by all said power devices is substantially identical and minimal.

Figure 45:
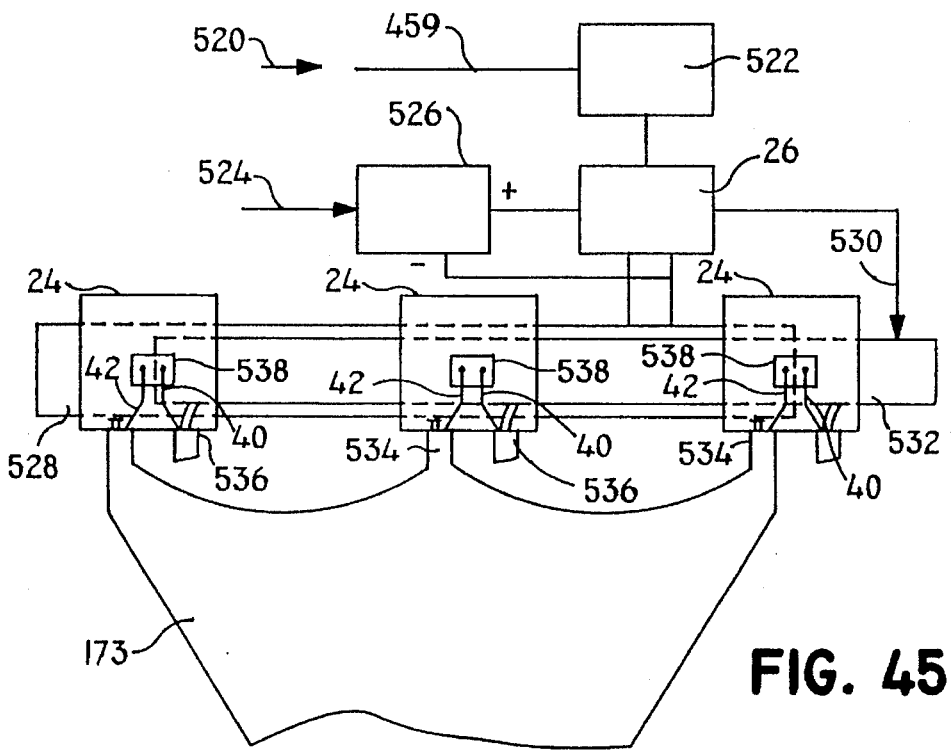
FIG. 45 is an illustration of electrically symmetric implementation of secondary source and gate leads from a driver attached to multiple output devices.
Figure 46:
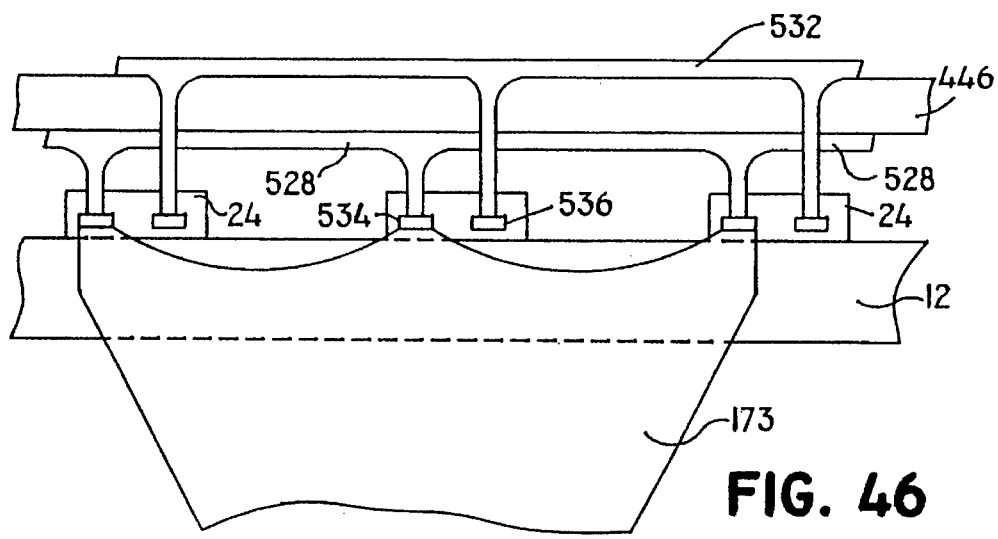
FIG. 46 is a top down view of FIG. 45.

Referring now to FIG. 45, shown is a schematic of the above described cluster construction. Common drive signal 520 is conducted to isolation 522 through co-axial cable 459 which then feeds said signal to driver 26. Input power 524 is fed to isolated power supply 526 which in turn powers common source sheet 528 mounted on board 446, and driver 26. Output drive line 530 interconnects driver 26. Output drive line 530 interconnects driver 26 and common drive sheet 532 which is preferably mounted on the surface of board 446 opposing common source sheet 528 (FIG. 46). Devices 24, here shown as packaged die, but which also may be die are mounted on drain 12 (FIG. 46). Source 42 and gate 40 lead bond wires, internal to packaged device 24 connect respectively to external package source tabs 534 and gate tabs 536. Source tabs 534 from multiple devices 24 are connected to tapered source segment 173. External source 534 and gate 536 tabs are cut as short as possible to minimize inductance. Board 446 is mounted close to multiple devices 24 to minimize interconnect lengths for minimal inductance.

Again, referring to FIG. 45, it is seen that internal source lead wire 42 comprises substantially the common path for both high current and the drive signal. Lead wire 42 is part of device package manufacture and is maintained as short as possible to minimize inductance. With automated or semi-automated lead wire bonding technique, wire 42 layout geometry within the package is highly reproducible from device to device with very small variation. Thus, from device to device, the impedance of the common high current and drive signal path is substantially identical, and with short wire 42 length it is also minimal. To further reduce source wire 42 length, base die 538 would be used. This eliminates device packaging 24 and the associated added wire 42 length as well as the need for source tab 534. Thus, minimal inductance and lowest overall impedance is obtained. The foregoing illustrates electrically symmetric construction of an isolated driver and power source with common secondary source and gate leads wherein substantially uniform voltage-current characteristics are provided to each of the output devices thereby assuring substantially uniform current sharing.

The above design description may be seen in FIGS. 37, 38, 40 and 41 and with minor modifications may be applied to the circular symmetric board, e.g., 447, construction of FIGS. 1, 2, 3, 4, 7, 8, 18, 21, 43 and 44 as well as to the linear constructions of FIGS. 10–15, 17, 18 and 32.

Embodiments of the present invention employing multiple paralleled devices are characterized by electrically symmetric construction and a minimal output impedance. With electrical symmetry, the impedance between each device and the output terminal is substantially equal, i.e., uniform current sharing and minimal mutual cross coupling between devices. The current symmetry permits a system whereby the drive signal timing and amplitude to each device can be made substantially uniform.

Although the invention has been described in conjunction with the appended drawings, those skilled in the art will appreciate that the scope of the invention is not so limited. Various modifications in the selection and arrangement of the various components discussed herein may be made without departing from the spirit of the invention as set forth in the appended claims.

We claim:

1. A power control unit having first and second power connections, said unit comprising at least one cluster of semiconductor devices wherein the intrinsic characteristics of such semiconductor devices dominate the impedance of the unit, said cluster comprising:

first and second cluster power terminals;

first and second cluster control terminals;

a plurality of like semiconductor devices each having first and second power ports defining a controlled current path therebetween, and first and second control ports defining a control path for controlling the current flow through said controlled current path; and first and second electrically conductive interconnects;

the first interconnect being connected, at a predetermined first juncture, to the first cluster power terminal;

said plurality of devices being disposed relative to said first interconnect such that the current flow paths between the first juncture and the first power ports of each of the plurality of devices are each of substantially equal impedance;

the second interconnect connecting a second power port of each of the plurality of devices in common and being connected, at a predetermined second juncture, to the second cluster power terminal;

the plurality of devices being disposed relative to said second interconnect such that current flow paths between said device second power ports and the second juncture are each of substantially equal impedance;

the first control ports of each of the plurality of devices being electrically connected to the first cluster control terminal such that the current paths between the first cluster control terminal and the first control port of each of the plurality of devices are of substantially equal impedance; and the second control ports of each of the plurality of devices being electrically connected to the second cluster control terminal such that the current paths between the second cluster control terminal and the second control port of each of the plurality of devices are of substantially equal impedance.

2. The power control unit of claim 1 wherein said cluster further includes:

an electrically and thermally conductive substrate having a first surface to which a power port of each of the plurality of devices is electrically and thermally connected in predetermined relative disposition, the substrate operating as a heat sink for the plurality of devices;

said substrate being electrically connected to one of the interconnects.

3. The power control unit of claim 2 wherein:

the substrate first surface includes a first edge, the plurality of devices being disposed on the substrate first surface such that a nominal line joining the centers of the devices is substantially parallel to said edge; and the substrate includes a second surface at which heat is dissipated, the second surface including cooling fins extending in planes generally orthogonal to said nominal line joining the centers of the devices.

4. The power control unit of claim 1 wherein the second control port of each of the plurality of devices comprises one of the power ports of the device.

5. The power control unit of claim 2 wherein the second control port of each of the plurality of devices comprises one of the power ports of the device.

6. The power control unit of claim 4 wherein the device power ports comprise conductive elements, such that the control path includes a portion of the controlled current path and a portion of the device power port conductive element, and the electrical connection to the second cluster control terminal is disposed to minimize the impedance of the portion of the controlled current path and device power port conductive element included in the control path.

7. The power control unit of claim 2 wherein the plurality of clusters are relatively disposed in a generally circular configuration.

8. The power control unit of claim 1 wherein at least one of the interconnects comprises a conductive sheet tapered to an apex.

9. The power control unit of claim 2 wherein at least one of the interconnects comprises a conductive sheet tapered to an apex.

10. The power control unit of claim 8 wherein the tapered conductive sheet includes apertures to provide plural current paths to the apex of substantially equal impedance.

11. The power control unit of claim 1 including a plurality of semiconductor device clusters.

12. The power control unit of claim 2 including a plurality of semiconductor device clusters.

13. The power control unit of claim 11 wherein;

the unit further includes a first power unit interconnect, electrically connecting the first power terminal of each cluster to the unit first power connection, such that the impedance of the current flow paths between the first juncture of each cluster to the unit first power connection is substantially the same;

a second power unit interconnect electrically connecting the second power terminal of each cluster to the unit second power connection, such that the impedance of the current flow paths between the second juncture of each cluster to the unit second power connection are substantially the same;

the first interconnects of each of the clusters are of substantially the same impedance;

the second interconnects of each of the clusters are of substantially the same impedance;

the first cluster control terminal of each of the clusters is electrically isolated from the first cluster control terminal of the other clusters; and the second cluster control terminal of each of the clusters is electrically isolated from the second cluster control terminal of the other clusters.

14. The power control unit of claim 11 wherein the clusters are disposed in a generally circular configuration.

15. The power control unit of claim 11 wherein the clusters are connected in series between the unit power connections.

16. The power control unit of claim 11 including a plurality of parallel groups of series connected clusters wherein:

each group of series connected clusters is electrically connected to the unit first power connection through substantially the same impedance;

each group of series connected clusters is electrically connected to the unit second power connection through substantially the same impedance.

17. The power control unit of claim 1 wherein the first interconnect provides substantial uniform current sharing between the respective devices.

18. The power control unit of claim 17 wherein the second interconnect provides substantially uniform current sharing between the respective devices.

19. The power control unit of claim 1 wherein the impedance of the current flow paths between the first juncture and first power ports of the devices is minimized.

20. The power control unit of claim 2 wherein the impedance of the current flow paths between the first juncture and first power ports of the devices is minimized.

21. The power control unit of claim 1 wherein the impedance of the current flow paths between the second juncture and second power ports of the devices is minimized.

22. The power control unit of claim 2 wherein the impedance of the current flow paths between the second juncture and second power ports of the devices is minimized.

* * * * *